United States Patent [19]
Kagamihara

[11] Patent Number: 6,103,591
[45] Date of Patent: Aug. 15, 2000

[54] SEMICONDUCTOR DEVICE WITH AIR GAPS BETWEEN INTERCONNECTIONS AND METHOD OF FORMING THE SAME

[75] Inventor: Masaki Kagamihara, Tokyo, Japan

[73] Assignee: NEC Corporation, Tokyo, Japan

[21] Appl. No.: 09/055,931

[22] Filed: Apr. 7, 1998

[30] Foreign Application Priority Data

Apr. 7, 1997 [JP] Japan .................................... 9-087105

[51] Int. Cl.⁷ .................................................. H01L 29/72
[52] U.S. Cl. ......................... 438/421; 438/619; 438/637; 438/638; 438/675
[58] Field of Search ................................... 438/421, 619, 438/637, 638, 675

[56] References Cited

U.S. PATENT DOCUMENTS 5,585,662  12/1996  Ogawa ..................................... 438/421

OTHER PUBLICATIONS

"Damascene", pp. 179–184, Semiconductor World, Dec. 1995 and (Abridged English translation).

*Primary Examiner*—Edward Wojciechowicz
*Attorney, Agent, or Firm*—Young & Thompson

[57] ABSTRACT

The present invention provides a method of forming a semiconductor device. The method comprises the following steps. At least a first opening and at least a second opening are concurrently formed in a dielectric layer which has a bottom portion having first level interconnections so that the first and second openings have a bottom level which lies over the first level interconnections. A dielectric film is deposited over the dielectric layer to form an inter-layer insulator so that top portions of the first and second openings are sealed with the dielectric film so as to form at least a first hollow portion and at least a second hollow portion serving as an air gap. A plurality of grooves are selectively formed in an upper portion of the inter-layer insulator so that at least one of the grooves extend on a top portion of the first hollow portion whereby the top portion of the first hollow portion reaches a bottom of the groove, and also so that the second hollow portion is disposed between adjacent two of the grooves. A bottom of the first hollow portion is selectively etched so that the bottom of the first hollow portion reaches a top of one of the first level interconnections so as to form a through hole which connects the at least one of the grooves to the one of the first level interconnections. Second level interconnections are formed in the grooves and a contact layer is formed in the through hole.

16 Claims, 31 Drawing Sheets

SEMICONDUCTOR DEVICE WITH AIR GAPS BETWEEN INTERCONNECTIONS AND METHOD OF FORMING THE SAME

BACKGROUND OF THE INVENTION

The present invention relates to a semiconductor device with air gaps between interconnections and a method of forming the same.

A conventional method of forming a semiconductor device will be described with reference to FIGS. 1A through 1D.

With reference to FIG. 1A, an inter-layer insulator 2 is formed on a bottom level interconnection 1. A first photo-resist film 12 is selectively formed over the inter-layer insulator 2. The inter-layer insulator 2 is then subjected to a dry etching by use of the first photo-resist film 12 as a mask to form trench grooves 7 which provide spaces for later formation process for forming second level interconnections, so that the trench grooves 7 have bottoms which lie over an interface between the first level interconnection 1 and the inter-layer insulator 2.

With reference to FIG. 1B, the first photo-resist film 12 is removed before a second photo-resist film 1213 is selectively formed on the inter-layer insulator 2 and within the trench grooves 7 except for a part of the trench groove 7. The inter-layer insulator 2 is further subjected to a further dry etching by use of the second photo-resist film 13 as a mask to form a through hole 8 which reaches the interface between the first level interconnection 1 and the inter-layer insulator 2 so that a part of the first level interconnection 1 is shown through the through hole 8.

With reference to FIG. 1C, the second photo-resist film 13 is removed before a metal film 10 of AlCu is entirely deposited by a high temperature sputtering method so that the metal film 10 extends over the inter-layer insulator 2 as well as within the trench grooves 7 and within the through hole 8.

With reference to FIG. 1D, the metal film 11 is then subjected to a chemical and mechanical polishing for selective removal of the metal film 11, so that the metal film 10 remain only within the trench grooves 7 and the through hole 8, whereby second level interconnections 11 are formed in the trench grooves 7 and a contact layer is formed in the through hole 8. As a result, the second level interconnections 11 are electrically connected through the contact layer to the first level interconnection 1.

The above fabrication processes are so called as Dual-Damascene Process which is effective for scaling down the semiconductor device and realizing quarter-micron design rule without raising a problem with a high cost of manufacturing the semiconductor device due to complicated fabrication processes.

The above Dual-Damascene Process, however, has the following problems. In order to reduce a capacitance between the same level interconnections, it is effective to form an air gap between the same level interconnections. The formation of the air gap between the same level interconnections requires a photo-resist technique. In the conventional fabrication processes, an inter-layer insulator has been formed before the inter-layer insulator is etched to form regions in which interconnections will be formed. An adjustment to conditions for forming the inter-layer insulator may prevent formation of the air gap. The air gap is formed as follows. A photo-resist film is formed over the inter-layer insulator. The photo-resist film is then patterned by a photolithography to form a mask. The inter-layer insulator is then subjected to a dry etching by use of the photo-resist film as a mask to form openings for formation of the air gap. The photo-resist film is removed before an insulation film is then formed over the inter-layer insulator and within the openings, thereby to form an air gap. The above processes are additional to the conventional fabrication processes.

In the above circumstances, it had been required to develop a novel method of forming air gaps between the same level interconnections without addition of the photo-resist process so that the air gaps reduce the parasitic capacitance between the interconnections. The reduction in the parasitic capacitance between the interconnections improves high speed performance of the semiconductor device.

SUMMARY OF THE INVENTION

Accordingly, it is an object of the present invention to provide a novel air gap between the same level interconnections free from the above problems.

It is a further object of the present invention to provide a novel air gap between the same level interconnections which may be formed without addition of a photo-resist process.

It is a still further object of the present invention to provide a novel interconnection structure which has a reduced parasitic capacitance.

It is yet a further object of the present invention to provide a novel semiconductor device having an interconnection structure with air gaps.

It is furthermore object of the present invention to provide a novel method of forming an air gap between the same level interconnections free from the above problems.

It is moreover object of the present invention to provide a novel method of forming an air gap between the same level interconnections without addition of a photo-resist process.

It is still more object of the present invention to provide a novel method of forming an interconnection structure which has a reduced parasitic capacitance.

It is yet more object of the present invention to provide a novel method of forming a semiconductor device having an interconnection structure with air gaps at a low cost.

The above and other objects, features and advantages of the present invention will be apparent from the following descriptions.

The present invention provides a semiconductor device comprising an inter-layer insulator, first level interconnections extending on a bottom of the inter-layer insulator, second level interconnections extending on a top of the inter-layer insulator, at least a through hole formed in the inter-layer insulator so that the through hole provides a connection between the first level and second level interconnections, and a plurality of air gaps formed in the inter-layer insulator so that the air gaps are disposed between adjacent two of the second level interconnections, wherein the air gaps have substantially the same shape in plane view as the through hole.

The present invention also provides a method of forming a semiconductor device. The method comprises the following steps. At least a first opening and at least a second opening are concurrently formed in a dielectric layer which has a bottom portion having first level interconnections so that the first and second openings have a bottom level which lies over the first level interconnections. A dielectric film is deposited over the dielectric layer to form an inter-layer insulator so that top portions of the first and second openings are sealed with the dielectric film so as to form at least a first hollow portion and at least a second hollow portion serving as an air gap. A plurality of grooves are selectively formed in an upper portion of the inter-layer insulator so that at least one of the grooves extend on a top portion of the first hollow portion whereby the top portion of the first hollow portion reaches a bottom of the groove, and also so that the second hollow portion is disposed between adjacent two of the grooves. A bottom of the first hollow portion is selectively etched so that the bottom of the first hollow portion reaches a top of one of the first level interconnections so as to form a through hole which connects the at least one of the grooves to the one of the first level interconnections. Second level interconnections are formed in the grooves and a contact layer is formed in the through hole.

BRIEF DESCRIPTION OF THE DRAWINGS

Preferred embodiments according to the present invention will be described in detail with reference to the accompanying drawings.

DISCLOSURE OF THE INVENTION

Figure 1A:
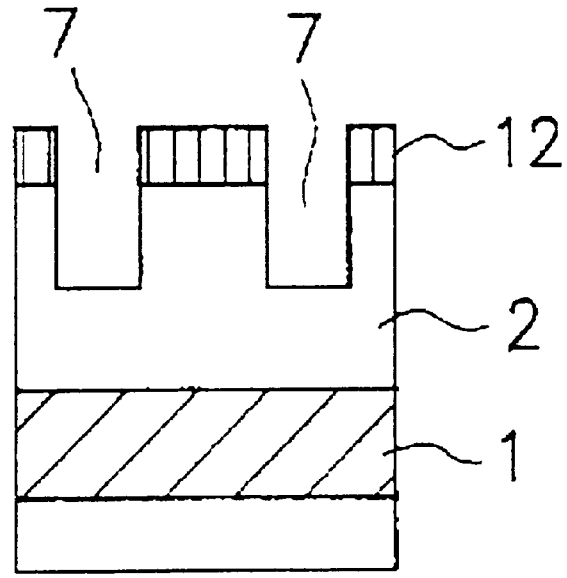
FIGS. 1A through 1D are fragmentary cross sectional elevation views illustrative of the conventional method of forming two level interconnections in a semiconductor device in sequential processes thereof.
Figure 1B:
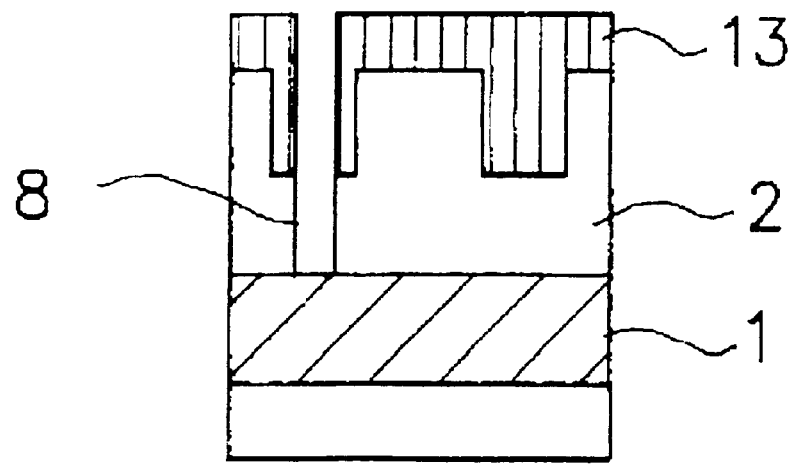
Figure 1C:
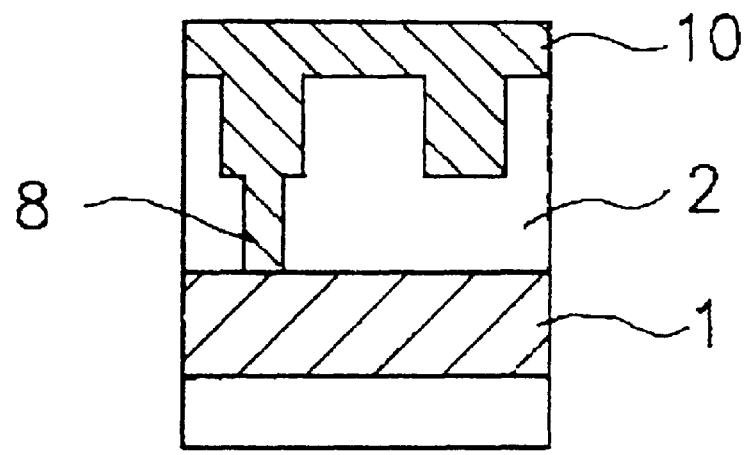
Figure 1D:
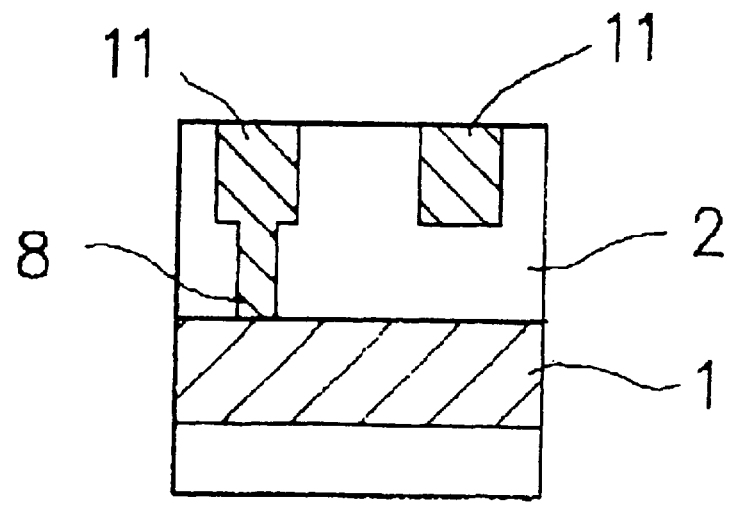

The first present invention provides an air gap structure comprising at least a hollow portion serving as an air gap which is formed in a dielectric layer and is disposed between adjacent two interconnections extending over the dielectric layer, wherein the hollow portion has substantially the same shape in plane view as a through hole formed in the dielectric layer.

It is preferable that a plurality of the hollow portion serving as air gaps are aligned in a direction long which the interconnections extend.

It is also preferable that a single alignment of the hollow portions serving as air gaps exists between adjacent two of the interconnections.

It is also preferable that a plurality of alignments of the hollow portions serving as air gaps exist between adjacent two of the interconnections.

It is also preferable that the dielectric layer is an inter-layer insulator between first and second level interconnections which are connected to each other by the through hole.

The second present invention provides a semiconductor device comprising an inter-layer insulator, first level interconnections extending a bottom of the inter-layer insulator, second level interconnections extending on a top of the inter-layer insulator, at least a through hole formed in the inter-layer insulator so that the through hole provides a connection between the first level and second level interconnections, and a plurality of air gaps formed in the inter-layer insulator so that the air gaps are disposed between adjacent two of the second level interconnections, wherein the air gaps have substantially the same shape in plane view as the through hole.

It is preferable that a plurality of the air gaps are aligned in a direction long which the second level interconnections extend.

It is also preferable that a single alignment of the air gaps exists between adjacent two of the second level interconnections.

It is also preferable that a plurality of alignments of the air gaps exist between adjacent two of the second level interconnections.

It is also preferable that the second level interconnections are formed in trench grooves formed in an upper region of the inter-layer insulator.

The third present invention provides a method of forming a semiconductor device. The method comprises the following steps. At least a first opening and at least a second opening are concurrently formed in a dielectric layer which has a bottom portion having first level interconnections so that the first and second openings have a bottom level which lies over the first level interconnections. A dielectric film is deposited over the dielectric layer to form an inter-layer insulator so that top portions of the first and second openings are sealed with the dielectric film so as to form at least a first hollow portion and at least a second hollow portion serving as an air gap. A plurality of grooves are selectively formed in an upper portion of the inter-layer insulator so that at least one of the grooves extend on a top portion of the first hollow portion whereby the top portion of the first hollow portion reaches a bottom of the groove, and also so that the second hollow portion is disposed between adjacent two of the grooves. A bottom of the first hollow portion is selectively etched so that the bottom of the first hollow portion reaches a top of one of the first level interconnections so as to form a through hole which connects the at least one of the grooves to the one of the first level interconnections. Second level interconnections are formed in the grooves and a contact layer is formed in the through hole.

It is preferable that the first and second openings are formed by a single dry etching process.

It is also preferable that a plurality of the second openings are formed so that the second openings are aligned in a direction along which the grooves extend.

It is also preferable that the through hole and the air gap have substantially the same shape in plane view as each other.

The fourth present invention provides a method of forming a semiconductor device. The method comprises the following steps. At least a first opening is formed in an inter-layer insulator which has a bottom portion having first level interconnections so that the first opening has a bottom portion which reaches a top of one of the first level interconnections. A plurality of grooves are selectively formed in an upper portion of the inter-layer insulator so that at least one of the grooves extends on a top portion of the first opening whereby the top portion of the first opening teaches a bottom of the groove to define a through hole. Second level interconnections are formed in the grooves and a contact layer is formed in the through hole. At least a second opening is formed in the inter-layer insulator so that the second opening is disposed between adjacent two of the second level interconnections. A dielectric film is deposited over the inter-layer insulator so that a top portion of the second opening is sealed with the dielectric film thereby to form a hollow portion serving as an air gap.

It is preferable that the first and second openings are formed by dry etching processes.

It is also preferable that a plurality of the second openings are formed so that the second openings are aligned in a direction along which the second level interconnections extend.

It is also preferable that the through hole and the air gap have substantially the same shape in plane view as each other.

The fifth present invention provides a method of forming a semiconductor device. The method comprises the following steps. At least a first opening is formed in a dielectric layer which has a bottom portion having first level interconnections so that the first opening has a bottom portion which reaches a top of one of the first level interconnections. At least a second opening is formed in the dielectric layer so that the second opening has a bottom level which lies over the first level interconnections. A dielectric film is deposited over the dielectric layer to form an inter-layer insulator so that top portions of the first and second openings are sealed with the dielectric film so as to form at least a first hollow portion and at least a second hollow portion serving as an air gap. A plurality of grooves are selectively formed in an upper portion of the inter-layer insulator so that at least one of the grooves extends on a top portion of the first hollow portion whereby the top portion of the first hollow portion reaches a bottom of the groove, and also so that the second hollow portion is disposed between adjacent two of the grooves. Second level interconnections are formed in the grooves and a contact layer is formed in the through hole.

It is preferable that the first and second openings are formed by dry etching processes.

It is also preferable that a plurality of the second openings are formed so that the second openings are aligned in a direction along which the second level interconnections extend.

It is also preferable that the through hole and the air gap have substantially the same shape in plane view as each other.

The sixth present invention provides a method of forming a semiconductor device. The method comprises the following steps. At least an opening is formed in a dielectric layer which has a bottom portion having first level interconnections so that the opening has a bottom portion which lies over a top of one of the first level interconnections. A dielectric film is deposited over the dielectric layer to form an inter-layer insulator so that a top portion of the opening is sealed with the dielectric film so as to form at least a hollow portion serving as an air gap. At least a through hole is formed in the inter-layer insulator so that the through hole reaches one of the first level interconnections. A plurality of grooves are selectively formed in an upper portion of the inter-layer insulator so that at least one of the grooves extends on a top portion of the through hole whereby the top portion of the through hole reaches a bottom of the groove, and also so that the hollow portion serving as the air gap is disposed between adjacent two of the grooves. Second level interconnections are formed in the grooves and a contact layer is formed in the through hole.

It is preferable that the opening and the through hole are formed by dry etching processes.

It is also preferable that a plurality of the openings are formed so that the openings are aligned in a direction along which the second level interconnections extend.

It is also preferable that the through hole and the air gap have substantially the same shape in plane view as each other.

PREFERRED EMBODIMENTS

First Embodiment

A first preferred embodiment according to the present invention will be described in detail with reference to FIGS. 2A, 2B, 2C, 3A, 3B, 3C, 4A, 4B, 4C, 5A, 5B, 5C, 6A, 6B, 6C, 7A,, 7B, 7C, 8A, 8B and 8C, in which a novel method of forming air gaps between interconnections in a semiconductor device is provided.

Figure 2A:
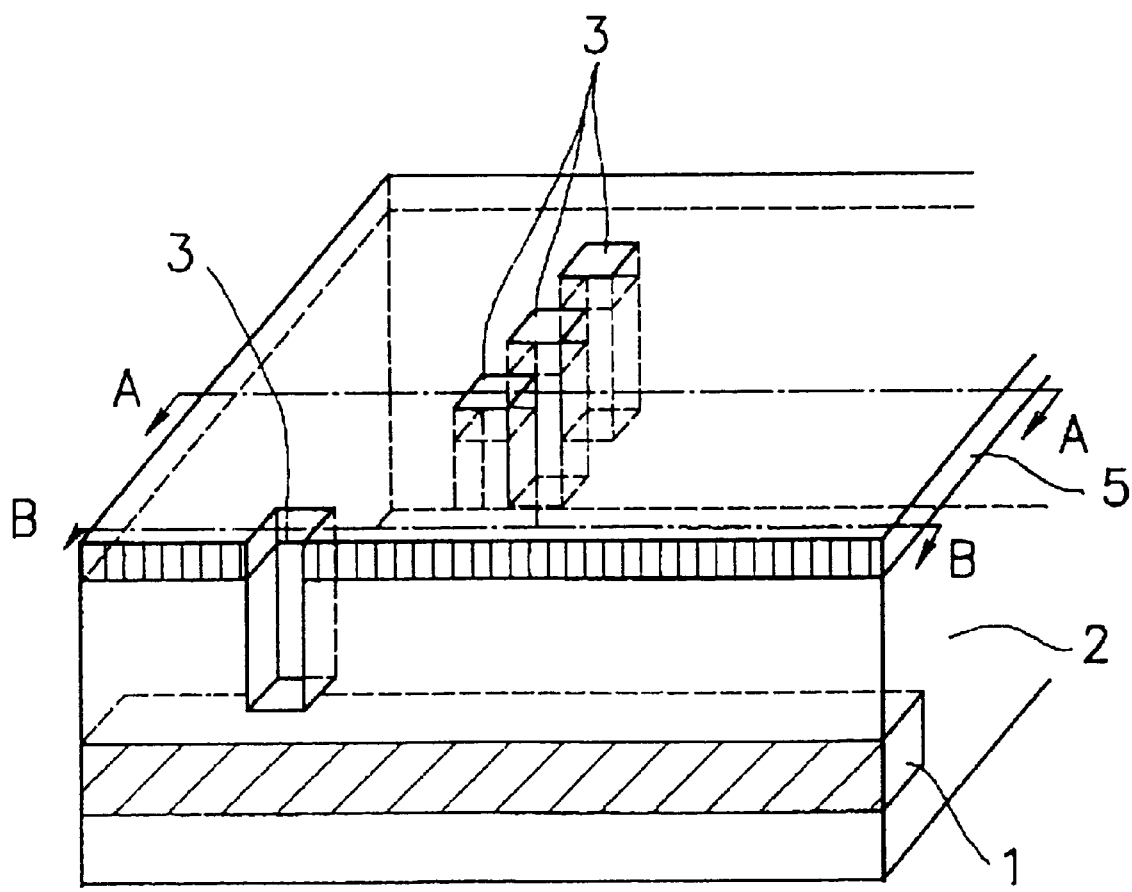
FIG. 2A is a fragmentary schematic view illustrative of a semiconductor device with interconnections in a first step involved in a novel fabrication method for the semiconductor device in a first embodiment in accordance with the present invention.
Figure 2B:
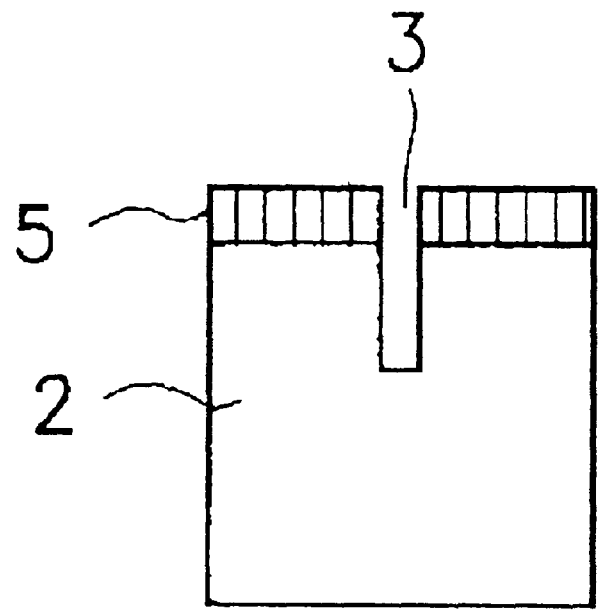
FIG. 2B is a fragmentary cross sectional elevation view illustrative of a semiconductor device with interconnections taken along an A—A line of FIG. 2A.
Figure 2C:
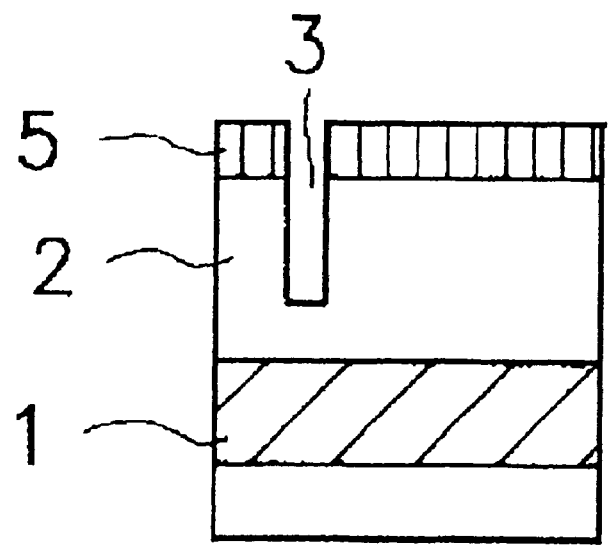
FIG. 2C is a fragmentary cross sectional elevation view illustrative of a semiconductor device with interconnections taken along a B—B line of FIG. 2A.

With reference to FIG. 2A, 2B and 2C, an inter-layer insulator 2 of silicon dioxide is formed over a first level interconnection 1. The inter-layer insulator 2 has about a thickness of 1.3 micrometers. A first photoresist film 5 is formed over the inter-layer insulator 2 and then patterned to form a first photo-resist mask 5 over the inter-layer insulator 2. The inter-layer insulator 2 is then subjected to a dry etching by use of the first photo-resist film 5 as a mask, whereby openings 3 of about 0.7 micrometers in depth are formed in the inter-layer insulator 2. The openings 3 are provided for allowing a later formation of air gaps and a through hole. For example, the through hole and the air gap have a minimum diameter of 0.4 micrometers square. A minimum pitch between the adjacent two openings 3 is 0.44 micrometers. The air gaps are arranged in the vicinity of the center between the interconnections which extend in parallel to each other, so that the air gaps are arranged in a direction along parallel to the interconnections.

Figure 3A:
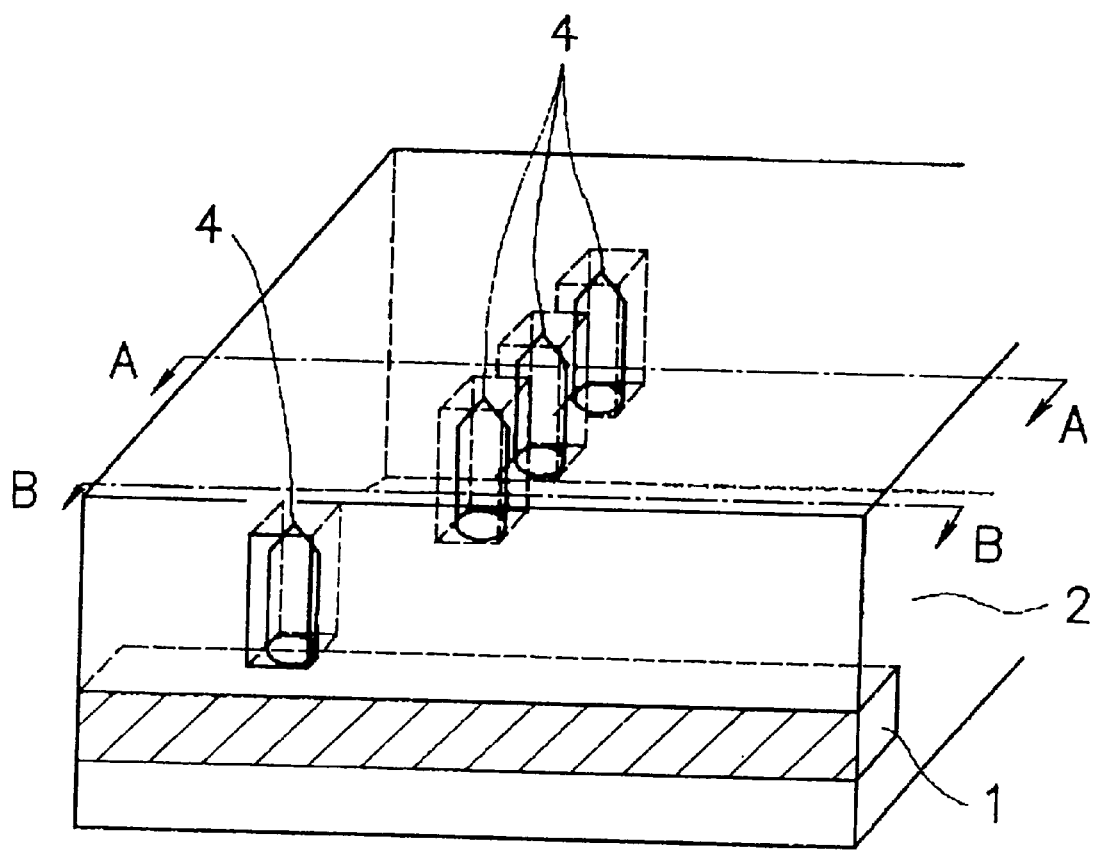
FIG. 3A is a fragmentary schematic view illustrative of a semiconductor device with interconnections in a second step involved in a novel fabrication method for the semiconductor device in a first embodiment in accordance with the present invention.
Figure 3B:
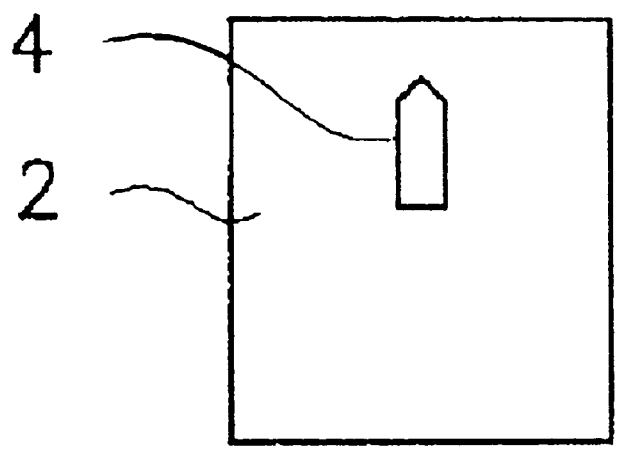
FIG. 3B is a fragmentary cross sectional elevation view illustrative of a semiconductor device with interconnections taken along an A—A line of FIG. 3A.
Figure 3C:
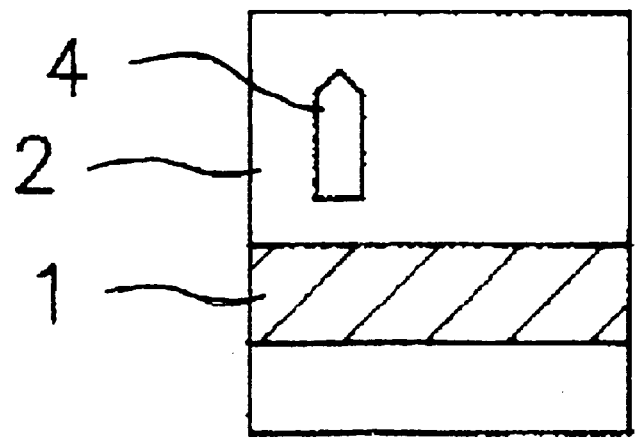
FIG. 3C is a fragmentary cross sectional elevation view illustrative of a semiconductor device with interconnections taken along a B—B line of FIG. 3A.

As illustrated in FIG. 3A, 3B and 3C, the first photo-resist film 5 is removed before a silicon oxide film 2 is entirely deposited over the interlayer insulator 2. Hollow portions 4 are then formed for allowing the intended formation of the through holes and air gaps by sealing the top portions of the hollow portions 4 with a silicon oxide film 2 which has been deposited entirely by an atmospheric pressure chemical vapor deposition, wherein vertical components of molecules deposited are reduced.

Figure 4A:
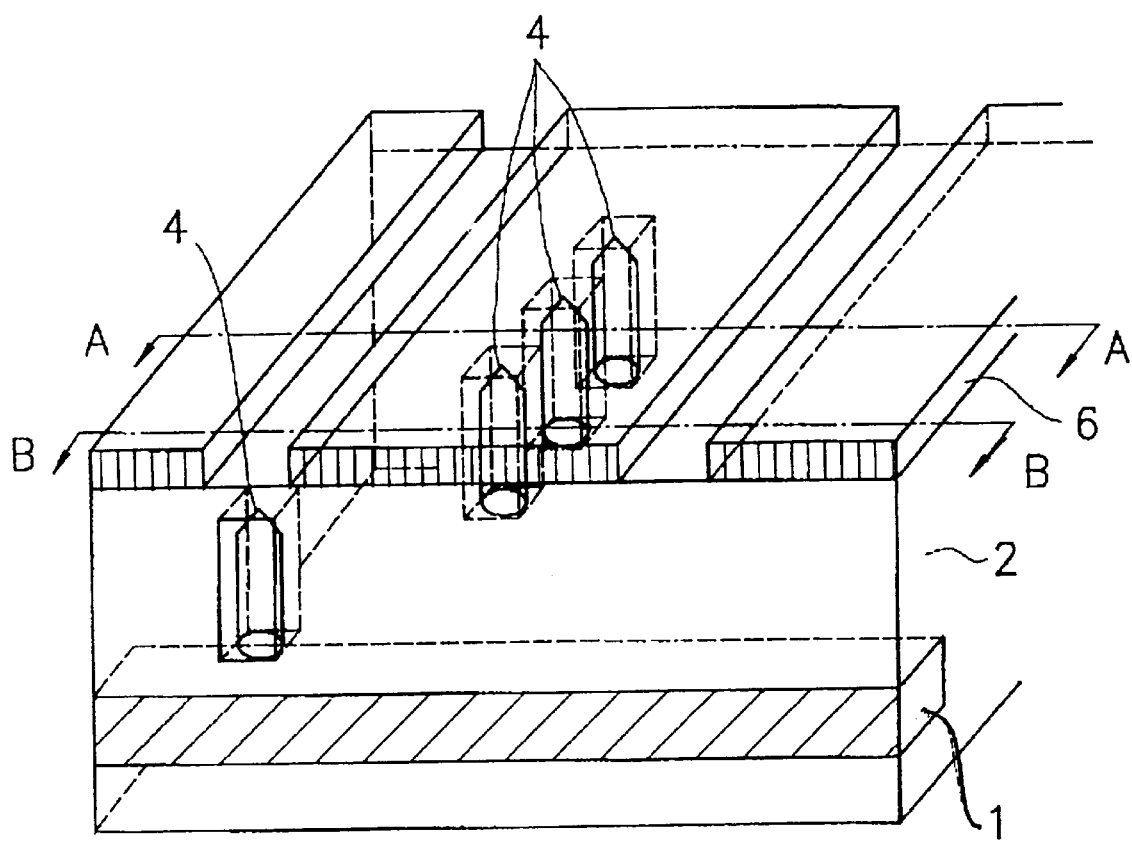
FIG. 4A is a fragmentary schematic view illustrative of a semiconductor device with interconnections in a third step involved in a novel fabrication method for the semiconductor device in a first embodiment in accordance with the present invention.
Figure 4B:
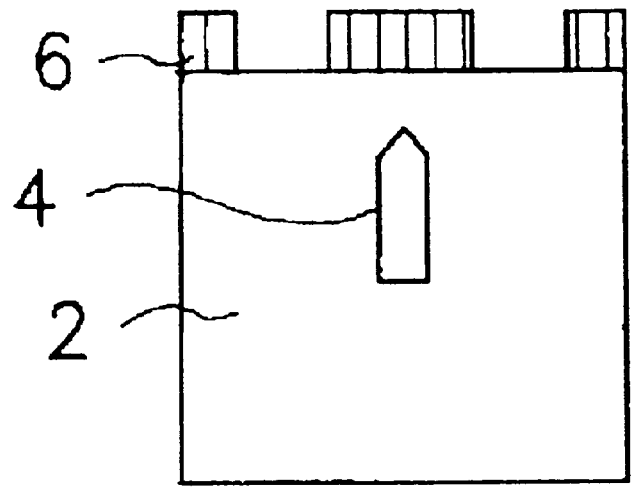
FIG. 4B is a fragmentary cross sectional elevation view illustrative of a semiconductor device with interconnections taken along an A—A line of FIG. 4A.
Figure 4C:
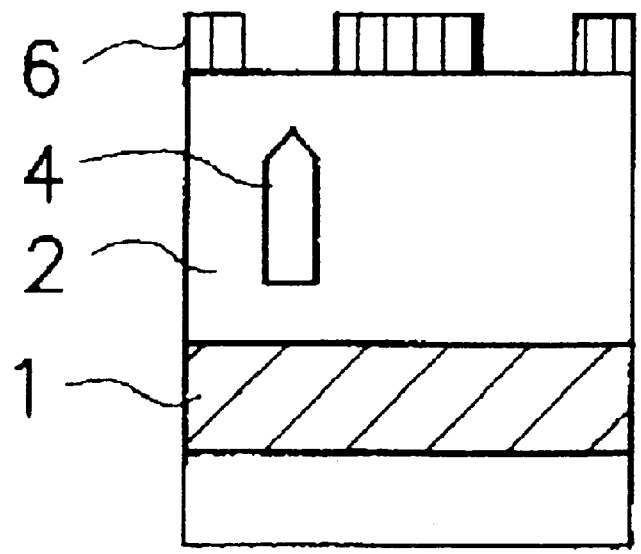
FIG. 4C is a fragmentary cross sectional elevation view illustrative of a semiconductor device with interconnections taken along a B—B line of FIG. 4A.

As illustrated in FIGS. 4A, 4B and 4C, a second photo-resist film 6 is formed over the inter-layer insulator 2 and then patterned to form a mask which defines regions on which interconnections are formed. A minimum size in width of the interconnection is 0.68 micrometers. A minimum pitch between the interconnections is 0.68 micrometers.

Figure 5A:
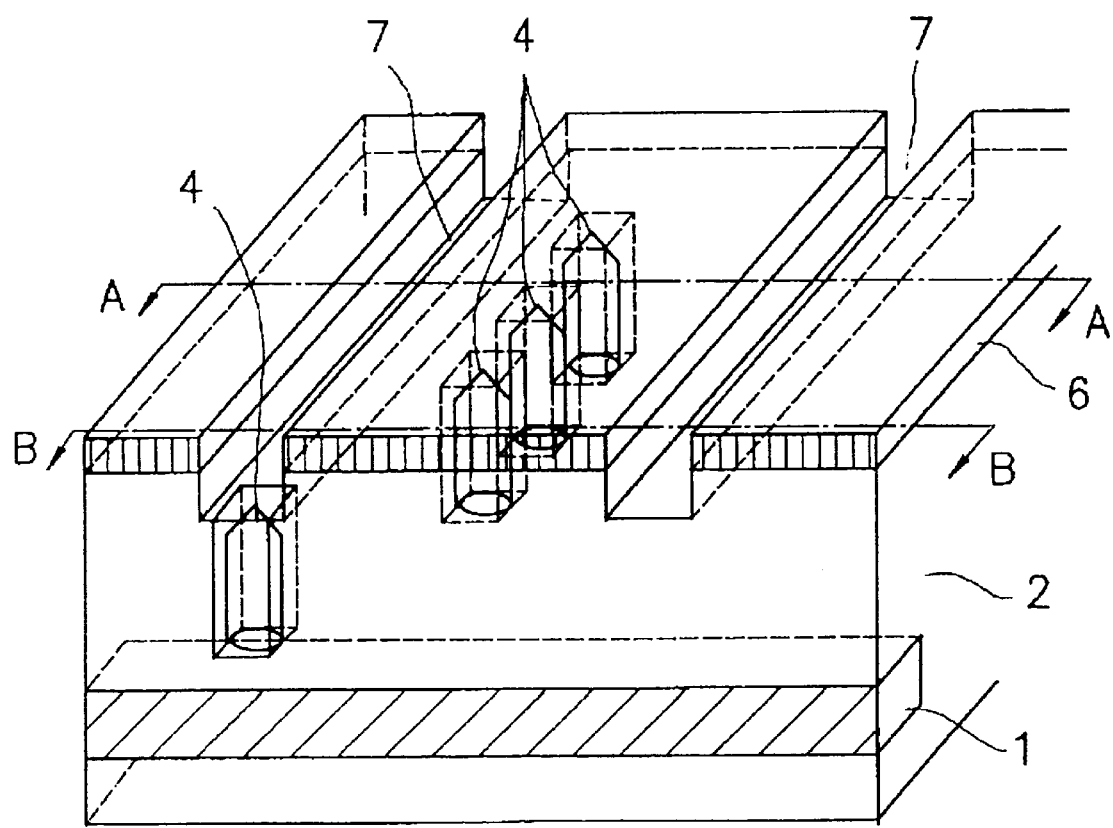
FIG. 5A is a fragmentary schematic view illustrative of a semiconductor device with interconnections in a fourth step involved in a novel fabrication method for the semiconductor device in a first embodiment in accordance with the present invention.
Figure 5B:
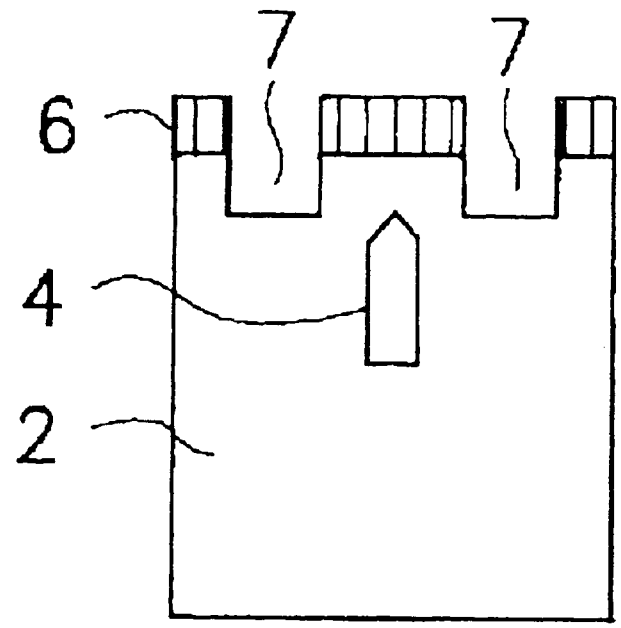
FIG. 5B is a fragmentary cross sectional elevation view illustrative of a semiconductor device with interconnections taken along an A—A line of FIG. 5A.
Figure 5C:
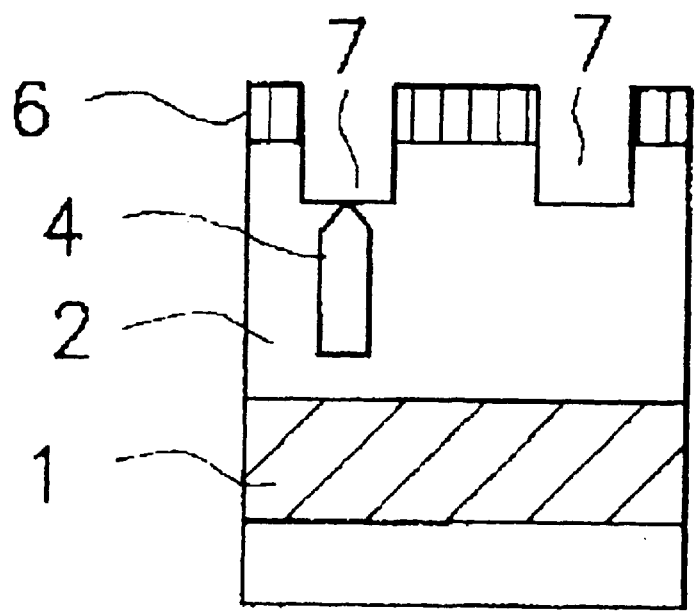
FIG. 5C is a fragmentary cross sectional elevation view illustrative of a semiconductor device with interconnections taken along a B—B line of FIG. 5A.

As illustrated in FIGS. 5A, 5B and 5C, the second photo-resist mask 6 is used to carry out a dry etching to the inter-layer insulator 2 thereby to form trench grooves 7 in the inter-layer insulator 2. The trench grooves 7 for interconnection are etched so that the bottom of the etched portion has a depth of about 0.4 micrometers, whereby the bottoms of the trench grooves 7 lie at the tops of the hollow portions 4 for through hole.

Figure 6A:
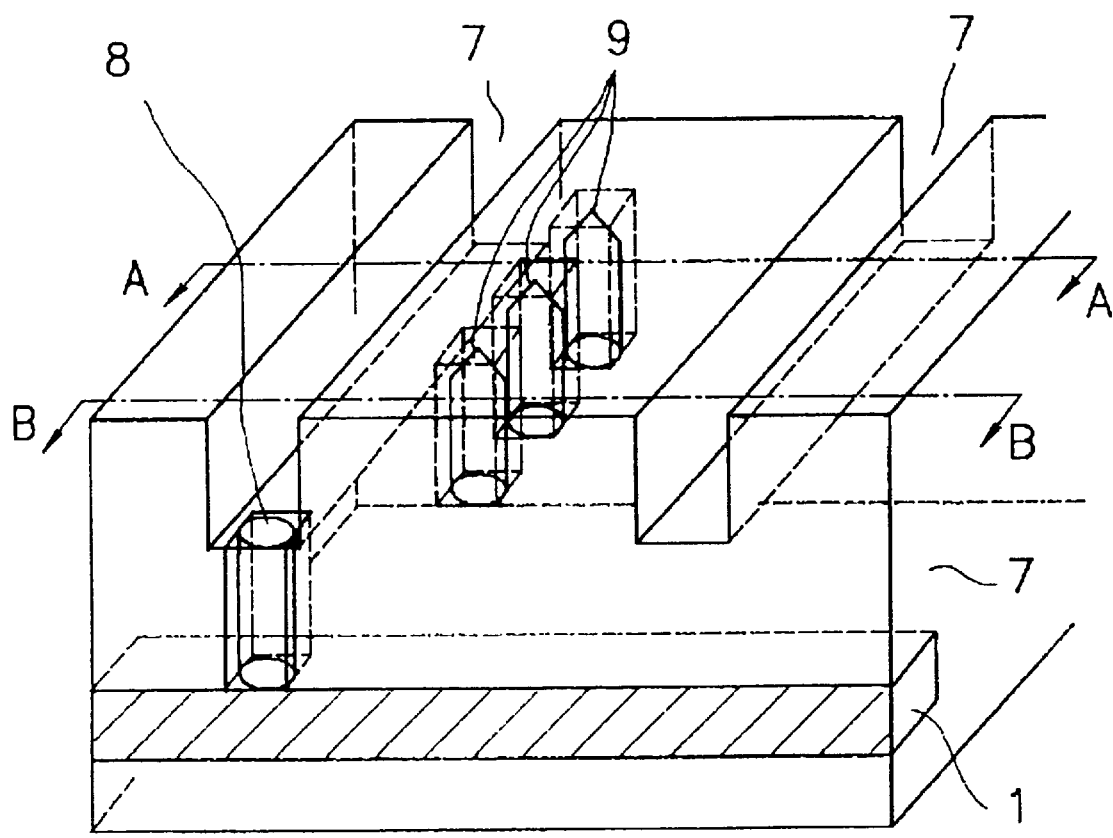
FIG. 6A is a fragmentary schematic view illustrative of a semiconductor device with interconnections in a fifth step involved in a novel fabrication method for the semiconductor device in a first embodiment in accordance with the present invention.
Figure 6B:
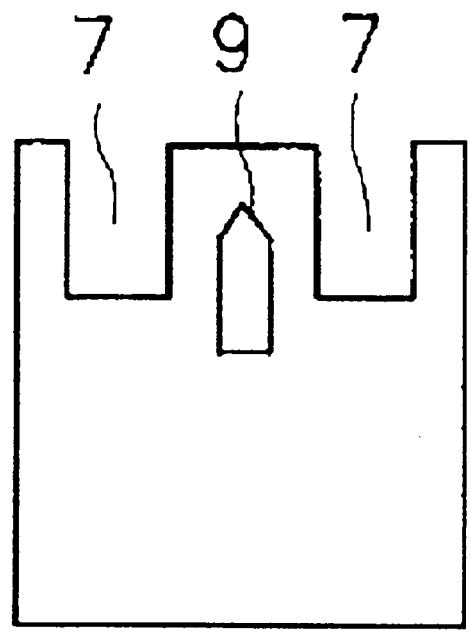
FIG. 6B is a fragmentary cross sectional elevation view illustrative of a semiconductor device with interconnections taken along an A—A line of FIG. 6A.
Figure 6C:
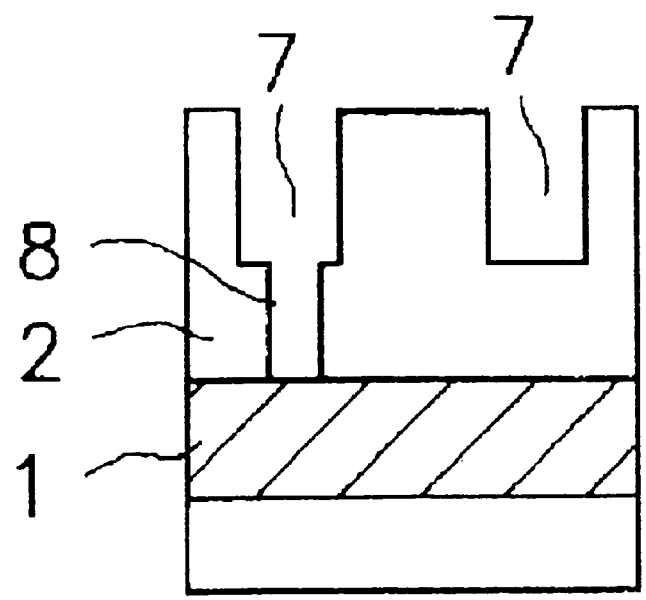
FIG. 6C is a fragmentary cross sectional elevation view illustrative of a semiconductor device with interconnections taken along a B—B line of FIG. 6A.

As illustrated in FIGS. 6A, 6B and 6C, the etching to the interlayer insulator 2 is continued so that the hollow portions 4 reach the first level interconnection 1. The inter-layer insulator 2 shown in FIG. 5A is further etched by about 0.2 micrometers whereby the bottoms of the hollow portions 4 reach the first level interconnection, resulting in formation of through holes 8. The hollow portions 4 other than the through hole 8 serve as air gaps 9. The second photo-resist film 6 is removed.

Figure 7A:
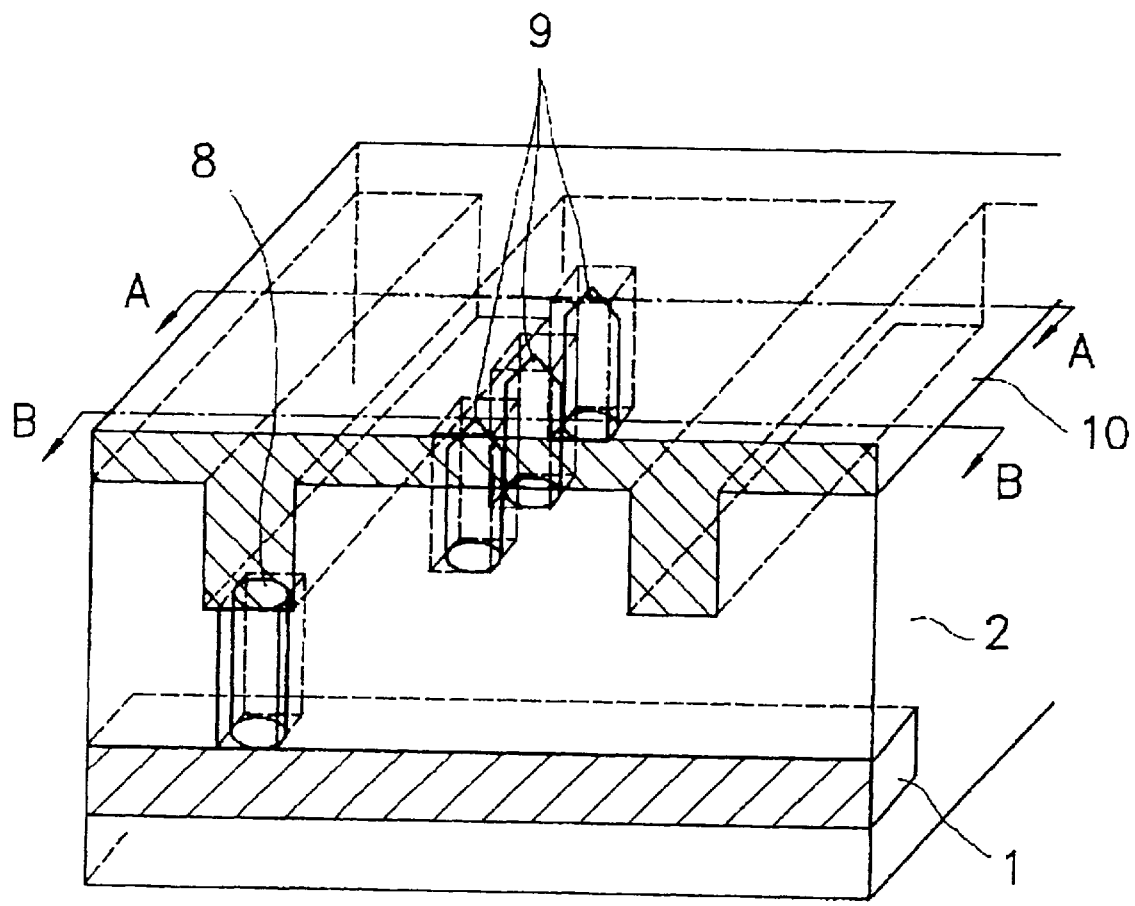
FIG. 7A is a fragmentary schematic view illustrative of a semiconductor device with interconnections in a sixth step involved in a novel fabrication method for the semiconductor device in a first embodiment in accordance with the present invention.
Figure 7B:
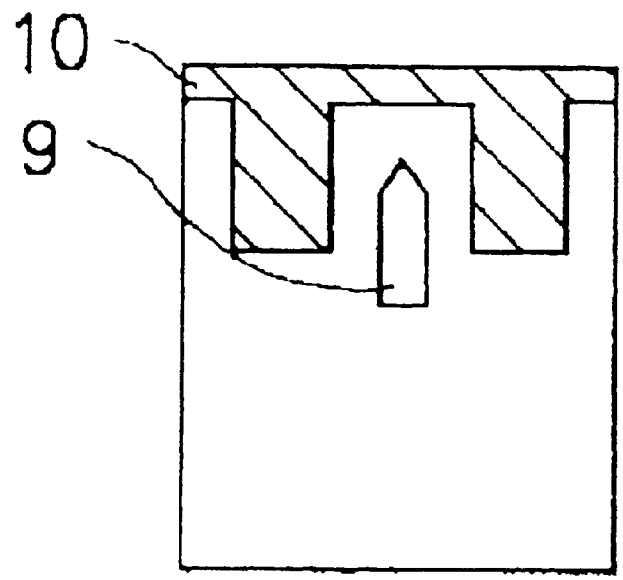
FIG. 7B is a fragmentary cross sectional elevation view illustrative of a semiconductor device with interconnections taken along an A—A line of FIG. 7A.
Figure 7C:
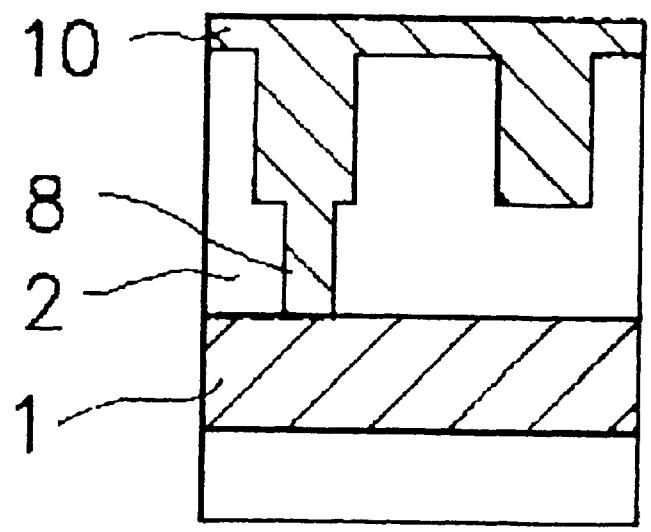
FIG. 7C is a fragmentary cross sectional elevation view illustrative of a semiconductor device with interconnections taken along a B—B line of FIG. 7A.

As illustrated in FIG. 7A, 7B and 7C, a metal film 10 made of AlCu is entirely deposited by a high temperature sputtering at 330° C. so that the metal film 10 has a thickness of about 1.8 micrometers and the metal film 10 fills the through hole 8 and the trench grooves 11 for interconnections.

Figure 8A:
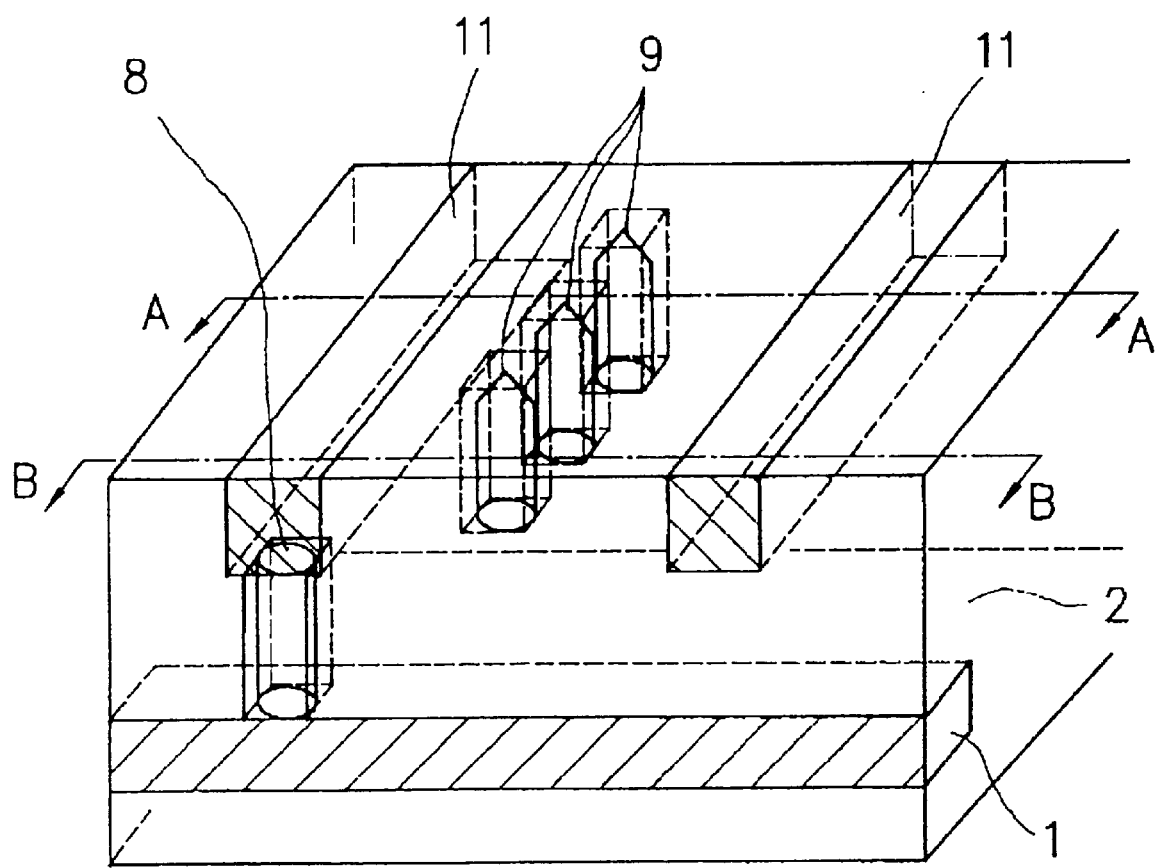
FIG. 8A is a fragmentary schematic view illustrative of a semiconductor device with interconnections in a seventh step involved in a novel fabrication method for the semiconductor device in a first embodiment in accordance with the present invention.
Figure 8B:
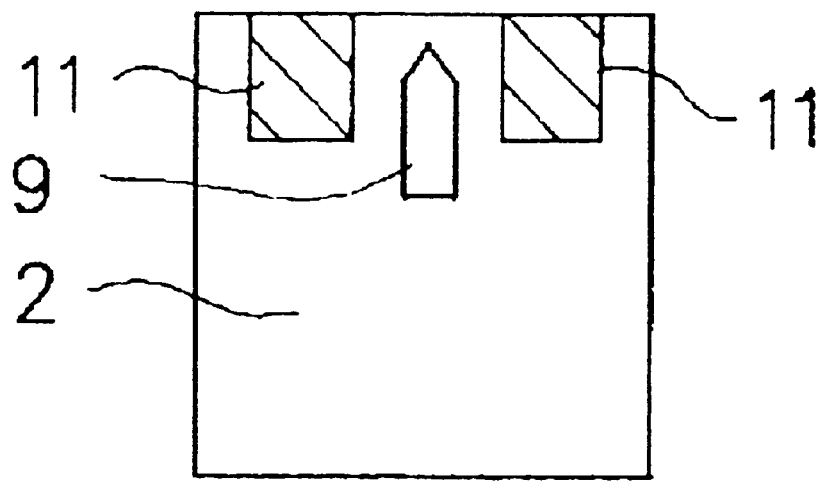
FIG. 8B is a fragmentary cross sectional elevation view illustrative of a semiconductor device with interconnections taken along an A—A line of FIG. 8A.
Figure 8C:
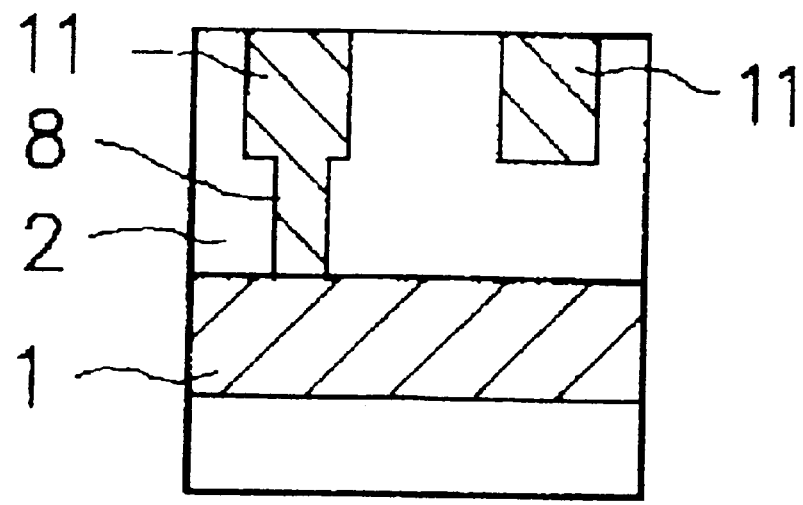
FIG. 8C is a fragmentary cross sectional elevation view illustrative of a semiconductor device with interconnections taken along a B—B line of FIG. 8A.

As illustrated in FIGS. 8A, 8B and 8C, the metal layer 10 is subjected to a chemical mechanical polishing so that the metal layer 10 remains only within the trench grooves 7 and planarized thereby to form interconnections 11.

In accordance with the present invention, as described above, the openings for air gaps and a through hole are simultaneously formed before the tops of the openings are sealed with an insulation film to subsequently form the through hole and the trench grooves for interconnections. The simultaneous formations of the holes for through hole and air gaps prior to the concurrent formations of the trench grooves and the through hole result in formation of the air gaps without additional photo-lithography for forming the photo-resist film.

The air gaps reduce the parasitic capacitance between adjacent two interconnections. The reduction in the parasitic capacitance between adjacent two interconnections results in improvement in cross-talk between the adjacent interconnections, thereby allowing further improvement in high speed performance and high density integration of the semiconductor device. If the AlCu interconnections have a thickness of 0.8 micrometers and a width of 0.68 micrometers are provided at a pitch of 0.52 micrometers, then the formations of the air gaps reduce the parasitic capacitance between the adjacent interconnections by about 25%.

Second Embodiment

A second preferred embodiment according to the present invention will be described in detail with reference to FIGS. 9A, 9B, 9C, 10A, 10B, 10C, 11A, 11B, 11C, 12A, 12B, 12C, 13A, 13B, 13C, 14A, 14B, 14C, 15A, 15B, 15C and 16 in which a novel method of forming air gaps between interconnections in a semiconductor device is provided.

Figure 9A:
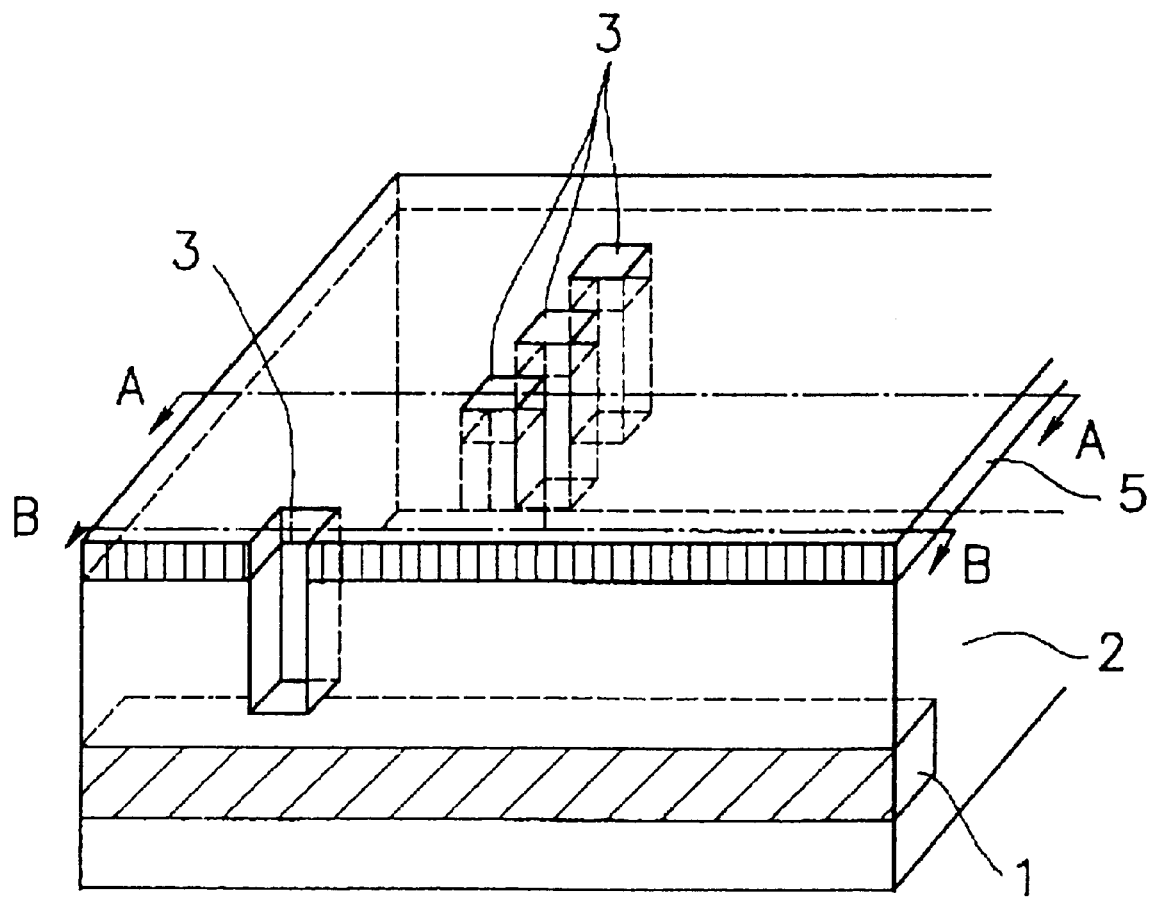
FIG. 9A is a fragmentary schematic view illustrative of a semiconductor device with interconnections in a first step involved in a novel fabrication method for the semiconductor device in a second embodiment in accordance with the present invention.
Figure 9B:
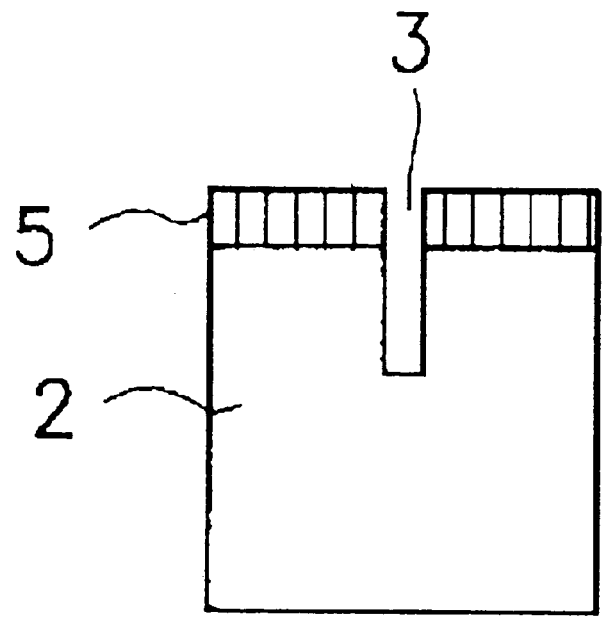
FIG. 9B is a fragmentary cross sectional elevation view illustrative of a semiconductor device with interconnections taken along an A—A line of FIG. 9A.
Figure 9C:
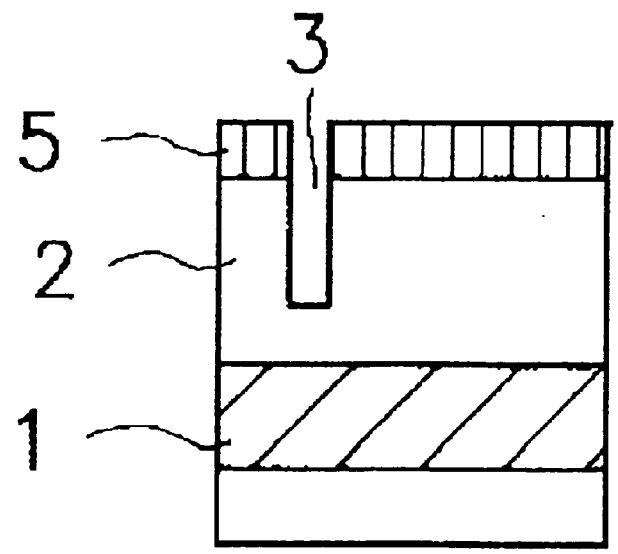
FIG. 9C is a fragmentary cross sectional elevation view illustrative of a semiconductor device with interconnections taken along a B—B line of FIG. 9A.

With reference to FIG. 9A, 9B and 9C, an inter-layer insulator 2 of silicon dioxide is formed over a first level interconnection 1. The interlayer insulator 2 has about a thickness of 1.3 micrometers. The inter-layer insulator 2 may be made of a dielectric with a low dielectric constant such as SiOF. The inter-layer insulator 2 may be formed by a plurality of depositions. The thickness of the inter-layer insulator 2 may be determined in consideration of the thickness between the first and second level interconnections as well as of the thickness of the interconnections. The thickness of the inter-layer insulator 2 may be adjusted by a chemical mechanical polishing. A first photo-resist film 5 is formed over the interlayer insulator 2 and then patterned to form a first photo-resist mask 5 over the inter-layer insulator 2. The inter-layer insulator 2 is then subjected to a dry etching by use of the first photo-resist film 5 as a mask, whereby openings 3 of about 0.7 micrometers in depth are formed in the inter-layer insulator 2. The openings 3 are provided for allowing a later formation of air gaps and a through hole. The air gaps are intended to be positioned in the vicinity of the center between the interconnections in parallel to each other so that the air gaps are arranged along a parallel direction to the interconnections. As the interconnections are arranged in parallel to each other at a small pitch, a parasitic capacitance between the adjacent two interconnections is large. If the air gap is provided between the interconnections having a small pitch, then the effect for reduction in parasitic capacitance between the adjacent two interconnections is large.

Since the positions of the air gaps are optionally determined by selecting the photo-resist mask, then it is possible that the air gaps are optionally provided not only a position between the interconnections having a small pitch but also other position between the interconnections having a large pitch. It is also possible that the air gaps differing in size are provided in consideration of the difference in pitch between the interconnections. The large size of the air gap is more effective to reduce the parasitic capacitance between the interconnections. If, however, the size of the hollow potions is excessively large, then it is difficult to seal the top portions of the large size hollow portions. This means it difficult to form large size air gaps. The formations of the large air gaps make small the margin between the interconnection and the air gap. It is preferable to have previously set the maximum size of the air gap.

It is also preferable to form no air gap when it is difficult to form the air gap on design or on manufacturing. It is also preferable to form no air gap at such a position that formation of the air gap does not provide a large effect for reduction in parasitic capacitance between the adjacent two interconnections. If, for example, the pitch of the interconnections is 1.52 micrometers, then it is possible that two alignments at a distance of 0.44 micrometers of the air gaps of 0.4 micrometers square are provided as illustrate din FIG. 16. If the pitch of the interconnections is 1.08 micrometers, then it is preferable to provide the air gaps of 0.4×0.8 micrometers.

Figure 10A:
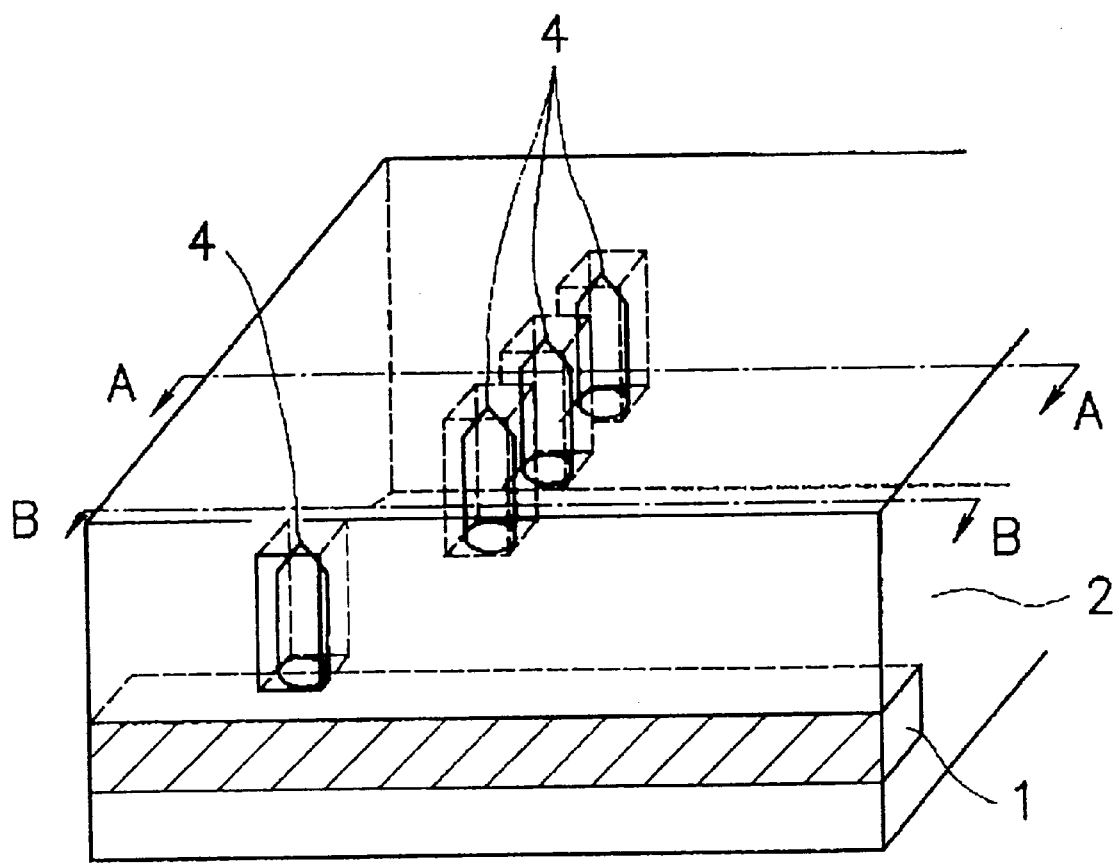
FIG. 10A is a fragmentary schematic view illustrative of a semiconductor device with interconnections in a second step involved in a novel fabrication method for the semiconductor device in a second embodiment in accordance with the present invention.
Figure 10B:
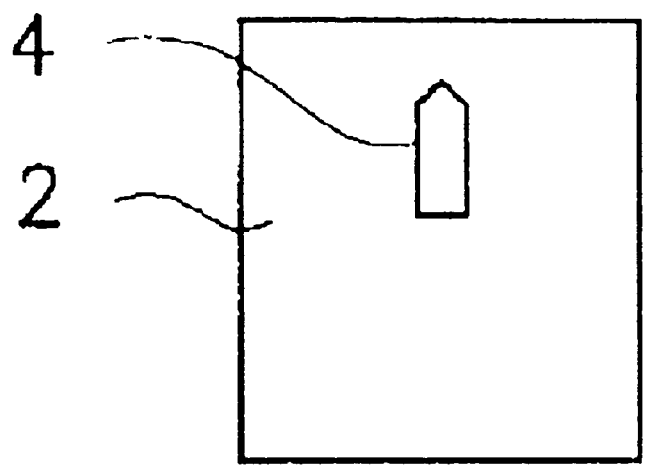
FIG. 10B is a fragmentary cross sectional elevation view illustrative of a semiconductor device with interconnections taken along an A—A line of FIG. 10A.
Figure 10C:
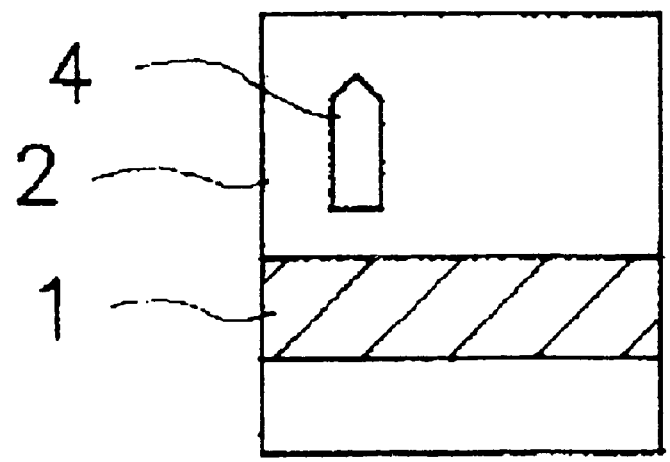
FIG. 10C is a fragmentary cross sectional elevation view illustrative of a semiconductor device with interconnections taken along a B—B line of FIG. 10A.

As illustrated in FIG. 10A, 10B and 10C, the first photo-resist film 5 is removed before a silicon oxide film 2 is entirely deposited over the inter-layer insulator 2. Hollow portions 4 are then formed for allowing the intended formation of the through holes and air gaps by sealing the top portions of the hollow portions 4 with a silicon oxide film 2 which has been deposited entirely by an atmospheric pressure chemical vapor deposition, wherein vertical components of molecules deposited are reduced.

Figure 11A:
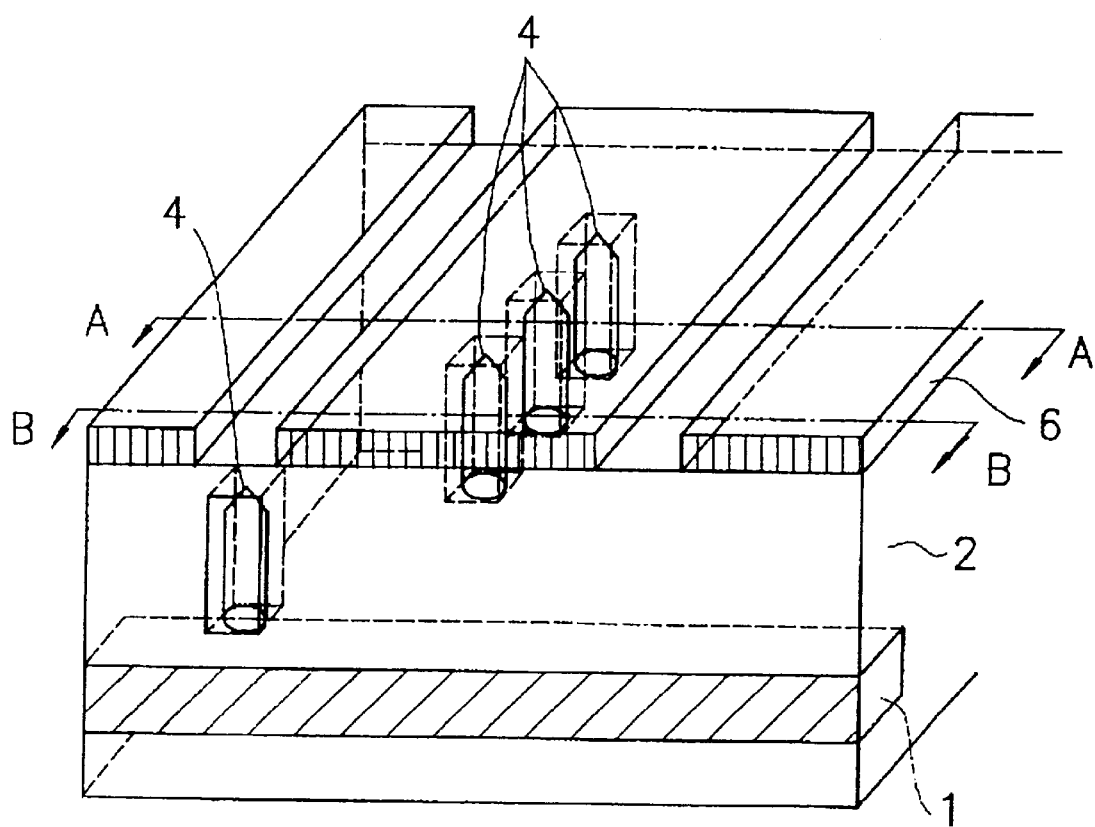
FIG. 11A is a fragmentary schematic view illustrative of a semiconductor device with interconnections in a third step involved in a novel fabrication method for the semiconductor device in a second embodiment in accordance with the present invention.
Figure 11B:
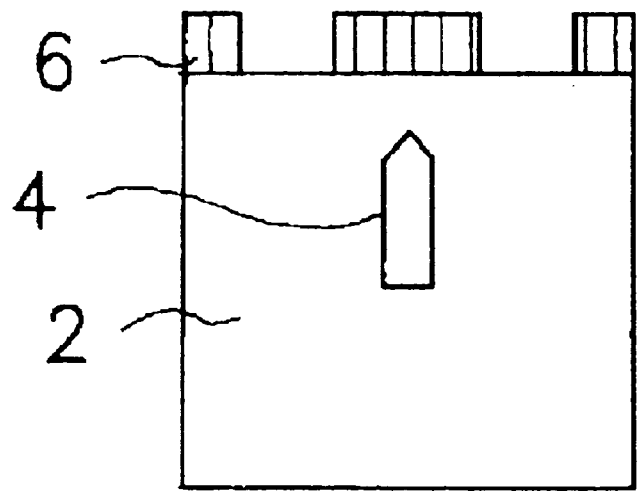
FIG. 11B is a fragmentary cross sectional elevation view illustrative of a semiconductor device with interconnections taken along an A—A line of FIG. 10A.
Figure 11C:
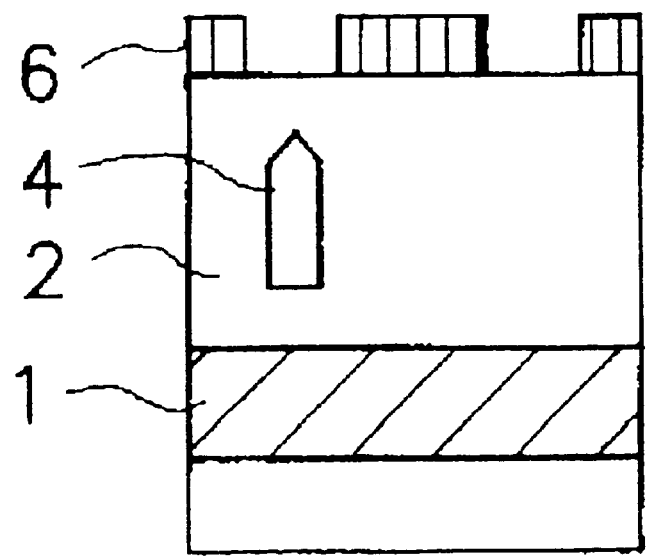
FIG. 11C is a fragmentary cross sectional elevation view illustrative of a semiconductor device with interconnections taken along a B—B line of FIG. 11A.

As illustrated in FIGS. 11A, 11B and 11C, a second photo-resist film 6 is formed over the inter-layer insulator 2 and then patterned to form a mask which defines regions on which interconnections are formed. A minimum size in width of the interconnection and a minimum pitch between the interconnections are determined in accordance with the design rule.

Figure 12A:
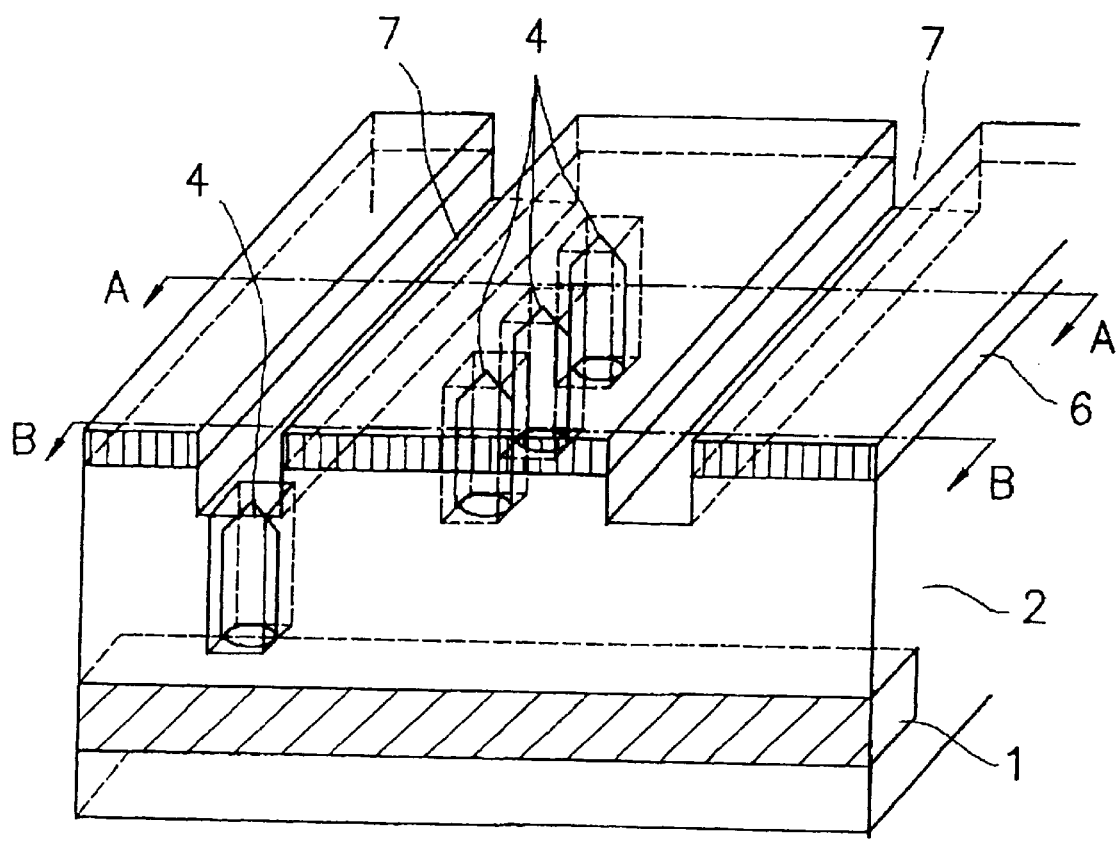
FIG. 12A is a fragmentary schematic view illustrative of a semiconductor device with interconnections in a fourth step involved in a novel fabrication method for the semiconductor device in a second embodiment in accordance with the present invention.
Figure 12B:
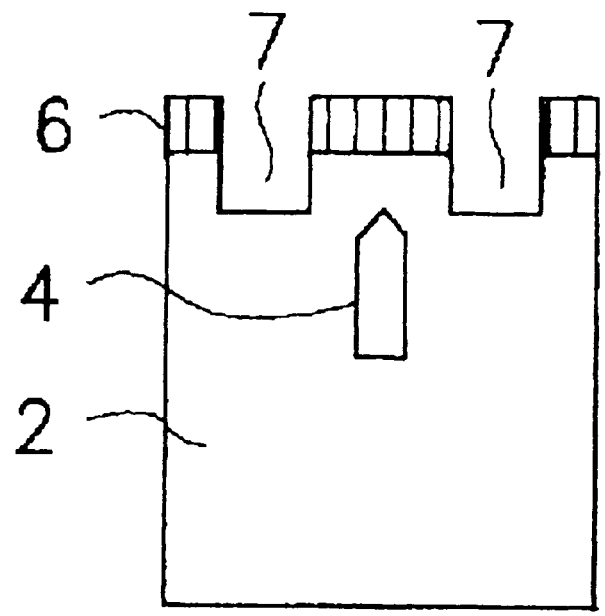
FIG. 12B is a fragmentary cross sectional elevation view illustrative of a semiconductor device with interconnections taken along an A—A line of FIG. 12A.
Figure 12C:
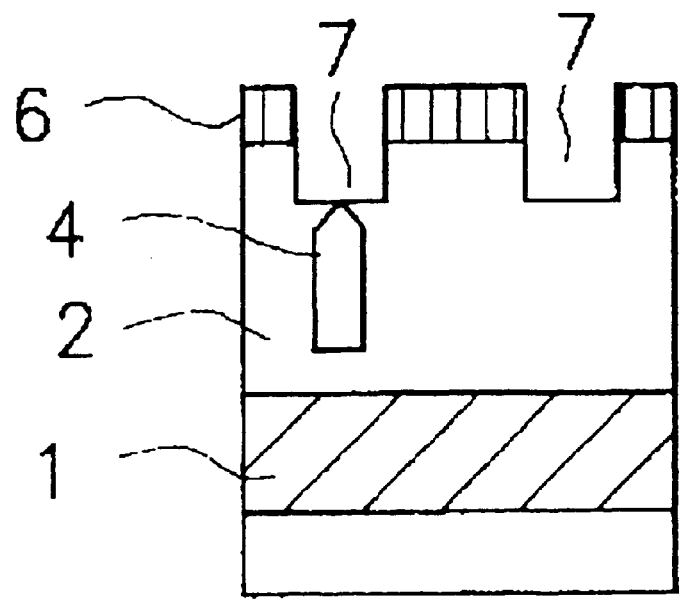
FIG. 12C is a fragmentary cross sectional elevation view illustrative of a semiconductor device with interconnections taken along a B—B line of FIG. 12A.

As illustrated in FIGS. 12A, 12B and 12C, the second photo-resist mask 6 is used to carry out a dry etching to the inter-layer insulator 2 thereby to form trench grooves 7 in the inter-layer insulator 2. The trench grooves 7 for interconnection are etched so that the bottom of the etched portion has a depth of about 0.4 micrometers, whereby the bottoms of the trench grooves 7 lie at the tops of the hollow portions 4 for through hole.

Figure 13A:
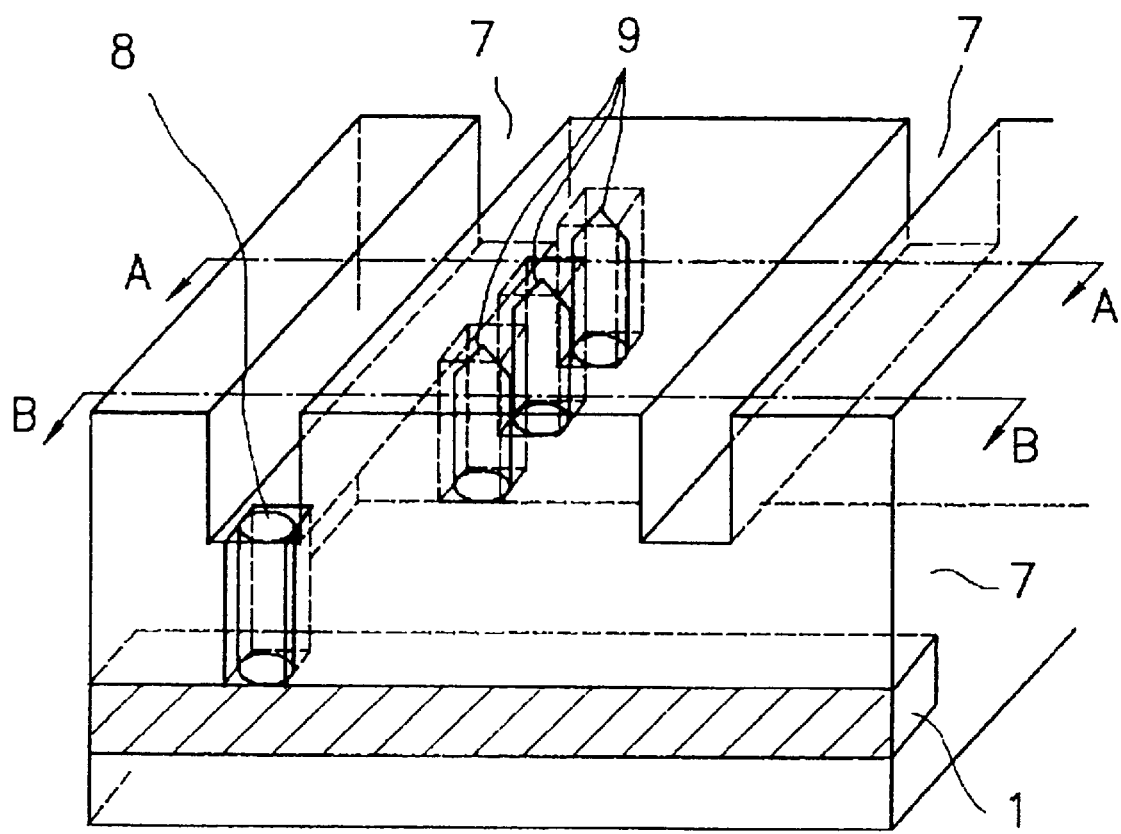
FIG. 13A is a fragmentary schematic view illustrative of a semiconductor device with interconnections in a fifth step involved in a novel fabrication method for the semiconductor device in a second embodiment in accordance with the present invention.
Figure 13B:
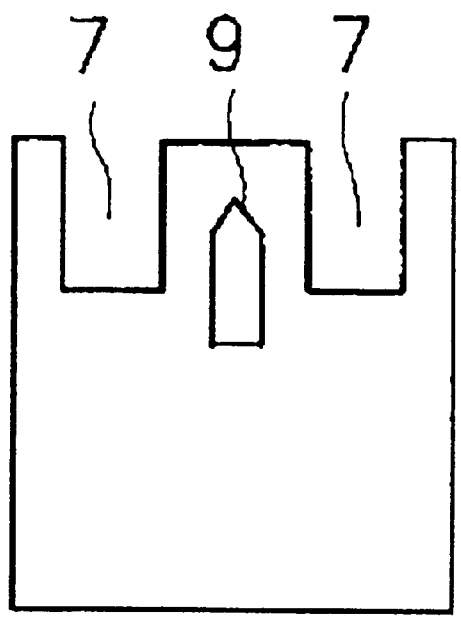
FIG. 13B is a fragmentary cross sectional elevation view illustrative of a semiconductor device with interconnections taken along an A—A line of FIG. 13A.
Figure 13C:
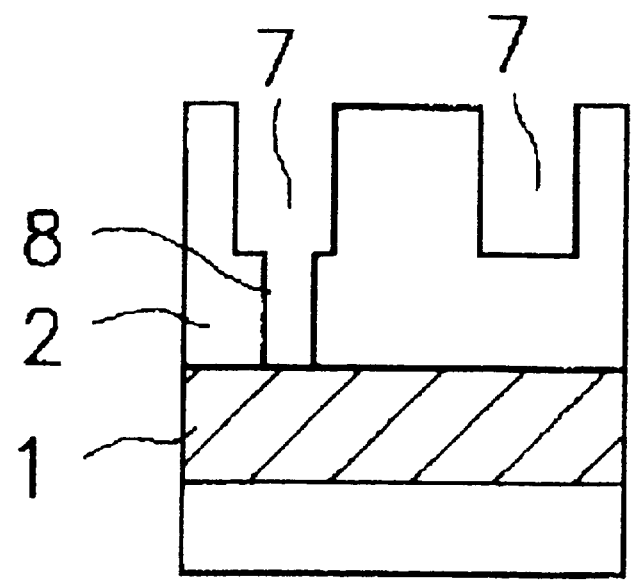
FIG. 13C is a fragmentary cross sectional elevation view illustrative of a semiconductor device with interconnections taken along a B—B line of FIG. 13A.

As illustrated in FIGS. 13A, 13B and 13C, the etching to the inter-layer insulator 2 is continued so that the hollow portions 4 reach the first level interconnection 1. The inter-layer insulator 2 shown in FIG. 5A is further etched by about 0.2 micrometers whereby the bottoms of the hollow portions 4 reach the first level interconnection, resulting in formation of through holes 8. The hollow portions 4 other than the through hole 8 serve as air gaps 9. The second photo-resist film 6 is removed.

Figure 14A:
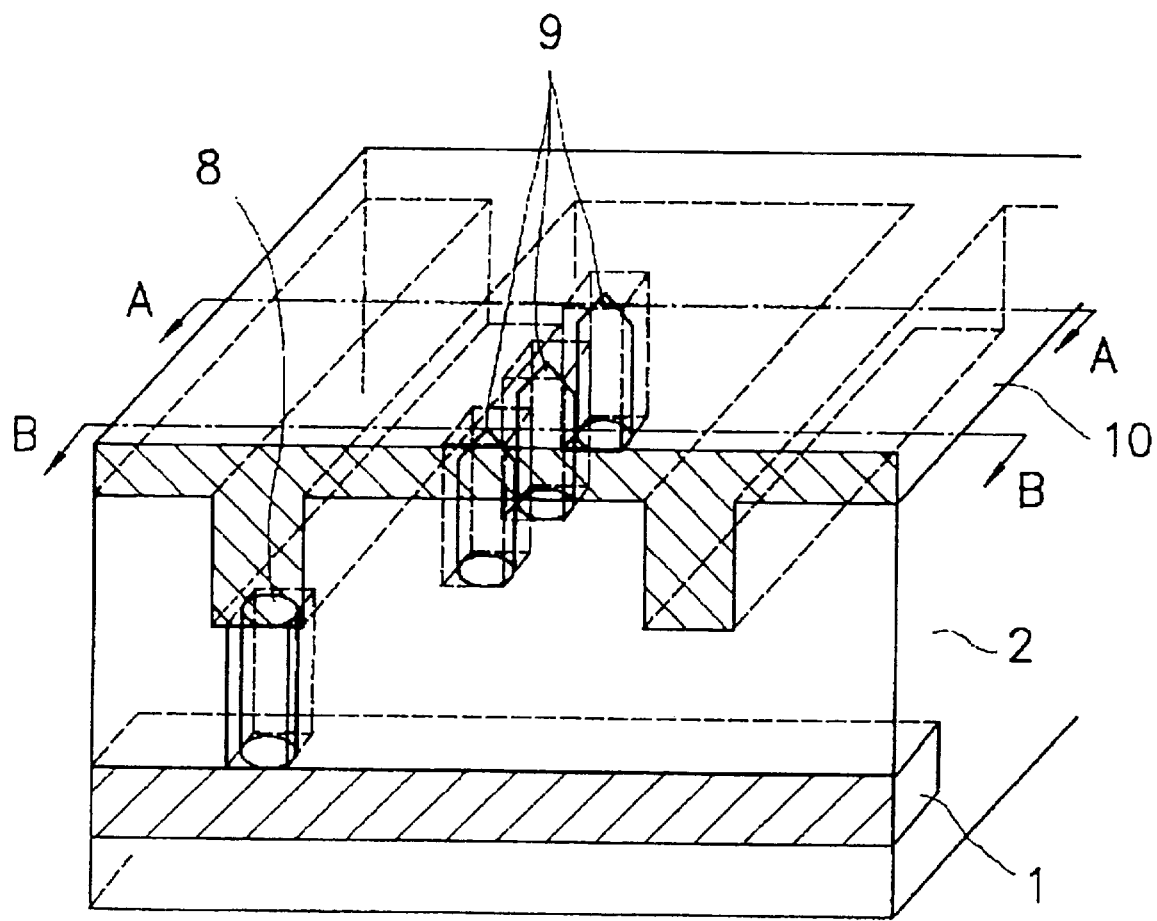
FIG. 14A is a fragmentary schematic view illustrative of a semiconductor device with interconnections in a sixth step involved in a novel fabrication method for the semiconductor device in a second embodiment in accordance with the present invention.
Figure 14B:
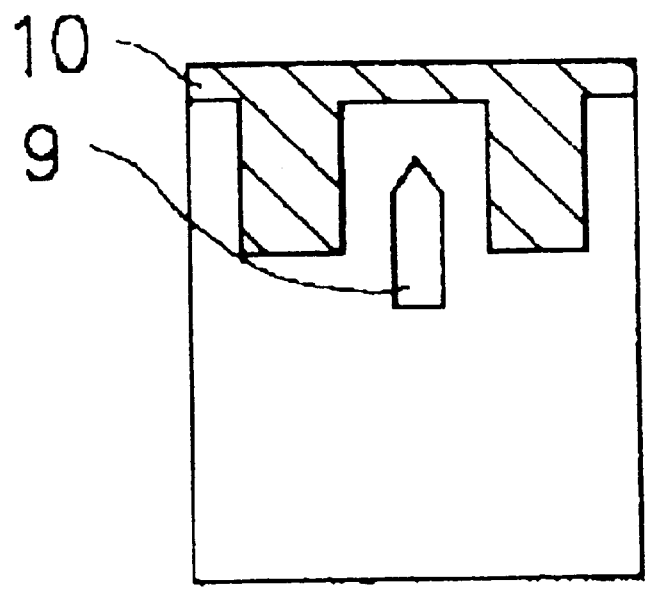
FIG. 14B is a fragmentary cross sectional elevation view illustrative of a semiconductor device with interconnections taken along an A—A line of PIG. 14A.
Figure 14C:
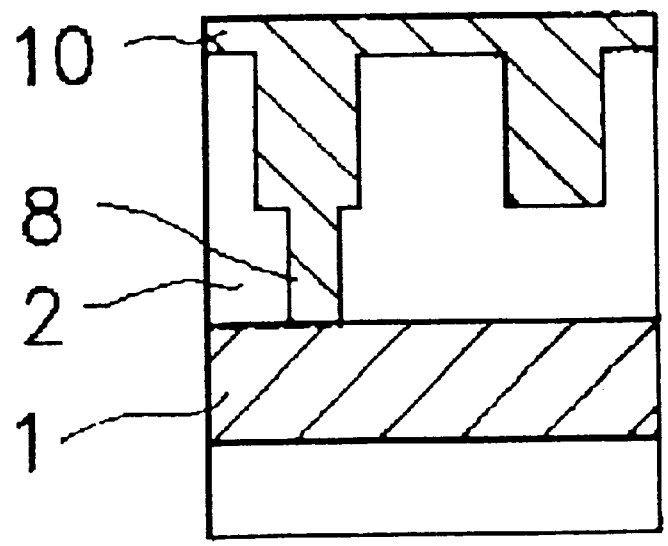
FIG. 14C is a fragmentary cross sectional elevation view illustrative of a semiconductor device with interconnections taken along a B—B line of FIG. 14A.

As illustrated in FIG. 14A, 14B and 14C, a metal film 10 made of AlCu is entirely deposited by a high temperature sputtering at 330° C. so that the metal film 10 has a thickness of about 1.8 micrometers and the metal film 10 fills the through hole 8 and the trench grooves 11 for interconnections. In place of AlCu, Al or Cu is also available. A temperature of the sputtering and a thickness of the metal layer may optionally be set at optimum values.

Figure 15A:
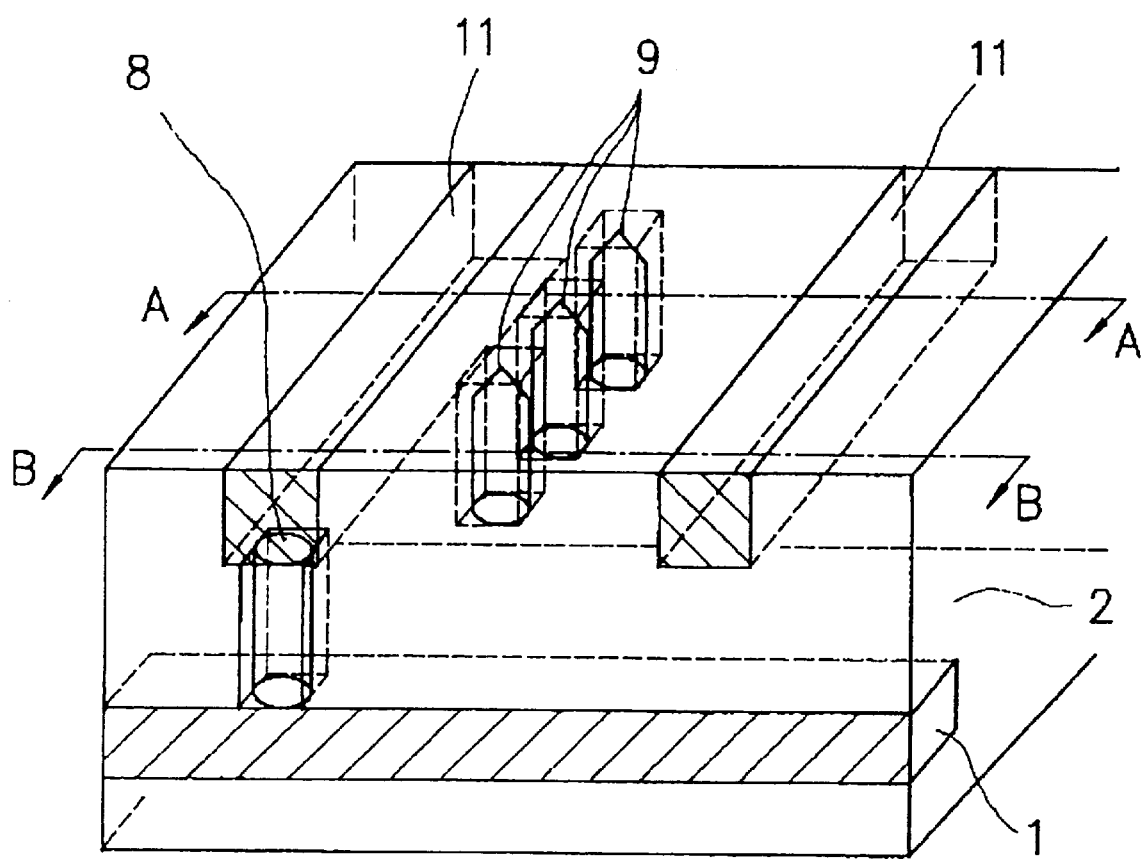
FIG. 15A is a fragmentary schematic view illustrative of a semiconductor device with interconnections in a seventh step involved in a novel fabrication method for the semiconductor device in a second embodiment in accordance with the present invention.
Figure 15B:
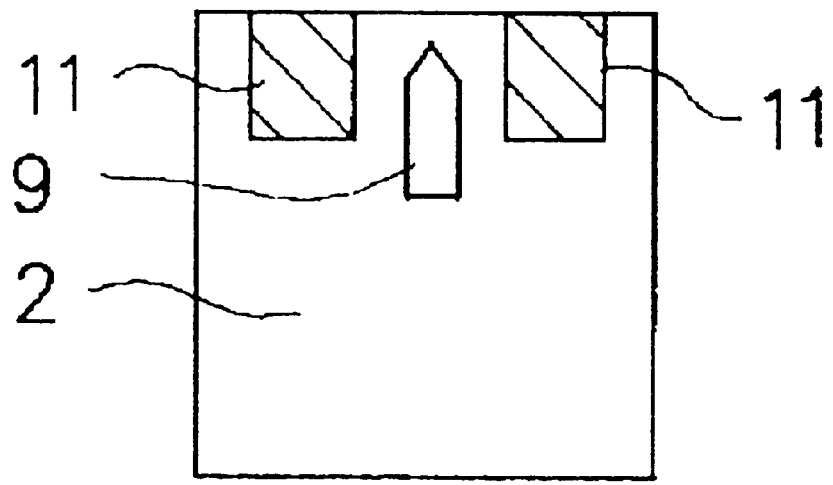
FIG. 15B is a fragmentary cross sectional elevation view illustrative of a semiconductor device with interconnections taken along an A—A line of FIG. 15A.
Figure 15C:
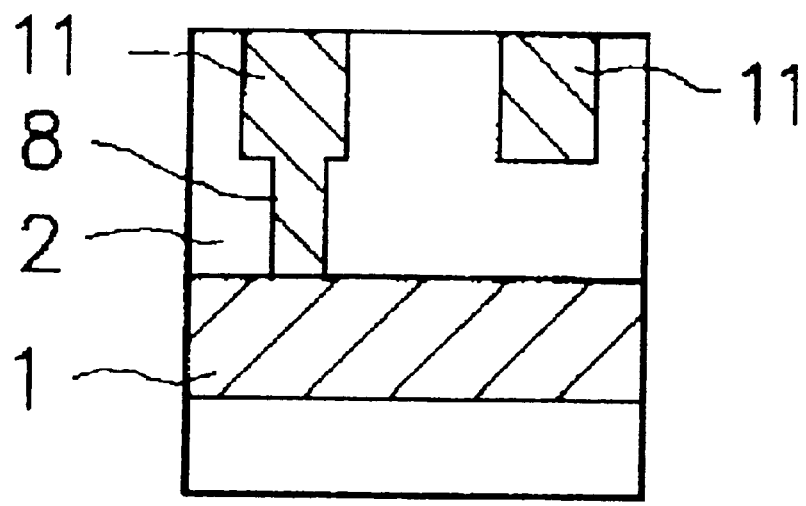
FIG. 15C is a fragmentary cross sectional elevation view illustrative of a semiconductor device with interconnections taken along a B—B line of FIG. 15A.
Figure 16:
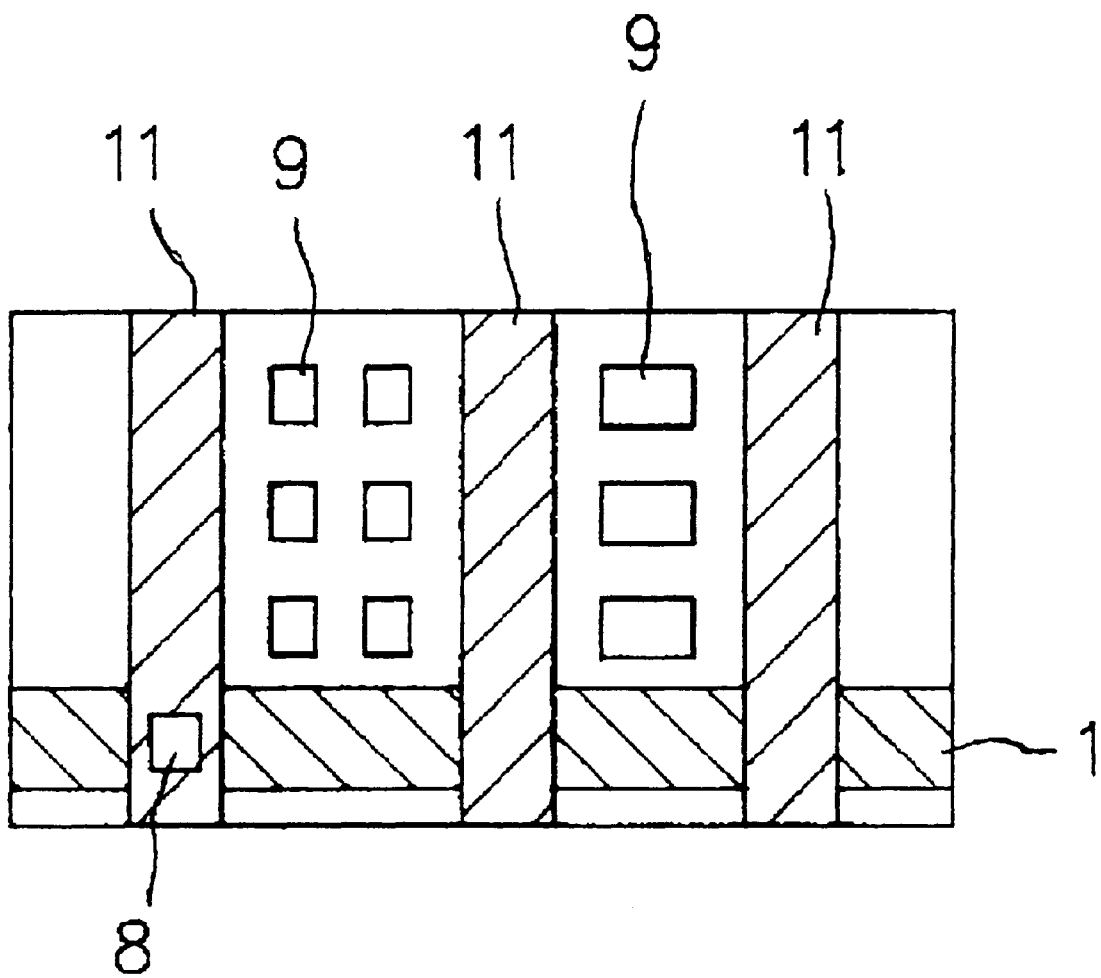
FIG. 16 is a plane view illustrative of a semiconductor device with interconnections in accordance with the present invention.

As illustrated in FIGS. 15A, 15B and 15C, the metal layer 10 is subjected to a chemical mechanical polishing so that the metal layer 10 remains only within the trench grooves 7 and planarized thereby to form interconnections 11.

In accordance with the present invention, as described above, the openings for air gaps and a through hole are simultaneously formed before the tops of the openings are sealed with an insulation film to subsequently form the through hole and the trench grooves for interconnections. The simultaneous formations of the holes for through hole and air gaps prior to the concurrent formations of the trench grooves and the through hole result in formation of the air gaps without additional photo-lithography for forming the photo-resist film.

The air gaps reduce the parasitic capacitance between adjacent two interconnections. The reduction in the parasitic capacitance between adjacent two interconnections results in improvement in cross-talk between the adjacent interconnections, thereby allowing further improvement in high speed performance and high density integration of the semiconductor device. If the AlCu interconnections have a thickness of 0.8 micrometers and a width of 0.68 micrometers are provided at a pitch of 0.52 micrometers, then the formations of the air gaps reduce the parasitic capacitance between the adjacent interconnections by about 25%.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A method of forming a semiconductor device, said method comprising the steps of:

concurrently forming at least a first opening and at least a second opening in a dielectric layer which has a bottom portion having first level interconnections so that said first and second openings have a bottom level which lies over said first level interconnections;

depositing a dielectric film over said dielectric layer to form an inter-layer insulator so that top portions of said first and second openings are sealed with said dielectric film so as to form at least a first hollow portion and at least a second hollow portion serving as an air gap;

selectively forming a plurality of grooves in an upper portion of said inter-layer insulator so that at least one of said grooves extends on a top portion of said first hollow portion whereby said top portion of said first hollow portion reaches a bottom of said groove, and also so that said second hollow portion is disposed between adjacent two of said grooves;

selectively etching a bottom of said first hollow portion so that said bottom of said first hollow portion reaches a top of one of said first level interconnections so as to form a through hole which connects said at least one of said grooves to said one of said first level interconnections and forming second level interconnections in said grooves and a contact layer in said through hole.

2. The method as claimed in claim 1, wherein said first and second openings are formed by a single dry etching process.

3. The method as claimed in claim 1, wherein a plurality of said second openings are formed so that said second openings are aligned in a direction along which said grooves extend.

4. The method as claimed in claim 1, wherein said through hole and said air gap have substantially the same shape in plane view as each other.

5. A method of forming a semiconductor device, said method comprising the steps of:

forming at least a first opening in an inter-layer insulator which has a bottom portion having first level interconnections so that said first opening has a bottom portion which reaches a top of one of said first level interconnections;

selectively forming a plurality of grooves in an upper portion of said inter-layer insulator so that at least one of said grooves extends on a top portion of said first opening whereby said top portion of said first opening reaches a bottom of said groove to define a through hole;

forming second level interconnections in said grooves and a contact layer in said through hole;

forming at least a second opening in said inter-layer insulator so that said second opening is disposed between adjacent two of said second level interconnections; and depositing a dielectric film over said inter-layer insulator so that a top portion of said second opening is sealed with said dielectric film thereby to form a hollow portion serving as an air gap.

6. The method as claimed in claim 5, wherein said first and second openings are formed by dry etching processes.

7. The method as claimed in claim 5, wherein a plurality of said second openings are formed so that said second openings are aligned in a direction along which said second level interconnections extend.

8. The method as claimed in claim 5, wherein said through hole and said air gap have substantially the same shape in plane view as each other.

9. A method of forming a semiconductor device, said method comprising the steps of:

forming at least a first opening in a dielectric layer which has a bottom portion having first level interconnections so that said first opening has a bottom portion which reaches a top of one of said first level interconnections;

forming at least a second opening in said dielectric layer so that said second opening has a bottom level which lies over said first level interconnections;

depositing a dielectric film over said dielectric layer to form an inter-layer insulator so that top portions of said first and second openings are sealed with said dielectric film so as to form at least a first hollow portion and at least a second hollow portion serving as an air gap;

selectively forming a plurality of grooves in an upper portion of said inter-layer insulator so that at least one of said grooves extends on a top portion of said first hollow portion whereby said top portion of said first hollow portion reaches a bottom of said groove, and also so that said second hollow portion is disposed between adjacent two of said grooves; and forming second level interconnections in said grooves and a contact layer in said through hole.

10. The method as claimed in claim 9, wherein said first and second openings are formed by dry etching processes.

11. The method as claimed in claim 9, wherein a plurality of said second openings are formed so that said second openings are aligned in a direction along which said second level interconnections extend.

12. The method as claimed in claim 9, wherein said through hole and said air gap have substantially the same shape in plane view as each other.

13. A method of forming a semiconductor device, said method comprising the steps of:

forming at least an opening in a dielectric layer which has a bottom portion having first level interconnections so that said opening has a bottom portion which lies over a top of one of said first level interconnections;

depositing a dielectric film over said dielectric layer to form an inter-layer insulator so that a top portion of said opening is sealed with said dielectric film so as to form at least a hollow portion serving as an air gap;

forming at least a through hole in said inter-layer insulator so that said through hole reaches one of said first level interconnections;

selectively forming a plurality of grooves in an upper portion of said inter-layer insulator so that at least one of said grooves extends on a top portion of said through hole whereby said top portion of said through hole reaches a bottom of said groove, and also so that said hollow portion serving as said air gap is disposed between adjacent two of said grooves; and forming second level interconnections in said grooves and a contact layer in said through hole.

14. The method as claimed in claim 13, wherein said opening and said through hole are formed by dry etching processes.

15. The method as claimed in claim 13, wherein a plurality of said openings are formed so that said openings are aligned in a direction along which said second level interconnections extend.

16. The method as claimed in claim 13, wherein said through hole and said air gap have substantially the same shape in plane view as each other.

* * * * *